(12) United States Patent
Shiraishi

(10) Patent No.: US 6,775,063 B2
(45) Date of Patent: Aug. 10, 2004

(54) OPTICAL SYSTEM AND EXPOSURE APPARATUS HAVING THE OPTICAL SYSTEM

(75) Inventor: Naomasa Shiraishi, Chiyoda-ku (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/191,550

(22) Filed: Jul. 10, 2002

(65) Prior Publication Data

US 2003/0011896 A1 Jan. 16, 2003

Related U.S. Application Data

(60) Provisional application No. 60/308,845, filed on Aug. 1, 2001.

(30) Foreign Application Priority Data

Jul. 10, 2001 (JP) .......................................... 2001-208713
Jul. 13, 2001 (JP) .......................................... 2001-214442

(51) Int. Cl.$^7$ ................................................. G02B 5/30
(52) U.S. Cl. ........................ 359/499; 359/497; 359/352; 355/67; 355/53
(58) Field of Search ................................. 359/494, 649, 359/251–253, 256, 156, 146, 484, 324, 495–497, 499, 352; 355/67, 77, 53, 83, 85, 86, 99

(56) References Cited

U.S. PATENT DOCUMENTS

| | | | |
|---|---|---|---|
| 6,137,626 A | 10/2000 | Takaoka | 359/386 |
| 6,201,634 B1 | 3/2001 | Sakuma et al. | 359/322 |
| 6,366,404 B1 | 4/2002 | Hiraiwa et al. | 359/494 |

(List continued on next page.)

FOREIGN PATENT DOCUMENTS

| | | |
|---|---|---|
| EP | 1 114 802 A1 | 7/2001 |
| JP | A-8-107060 | 4/1996 |
| JP | A-11-54411 | 2/1999 |
| JP | A-2000-331927 | 11/2000 |
| JP | 2000-331927 | 11/2002 |
| WO | WO 02/093209 A2 | 11/2002 |
| WO | WO 02/093257 A2 | 11/2002 |
| WO | WO 03/009021 A1 | 1/2003 |
| WO | WO 03/009062 A1 | 1/2003 |

OTHER PUBLICATIONS

Birefringence of CaF2, Kurt Natterman, International SEMATECH Calcium Fluoride Birefringence Work Shop, Jul. 2001.

Intrinsic birefringence in calcium fluoride and barium fluoride, Physical Review B, vol. 64, 241102(R), John H. Burnett et al., Nov. 29, 2001.

Intrinsic Birefringence in 157 nm Materials, John H. Burnett et al., 2$^{nd}$ International Symposium on 157 nm Lithography, May 15, 2001.

*Primary Examiner*—Georgia Epps
*Assistant Examiner*—M. Hasan
(74) *Attorney, Agent, or Firm*—Oliff & Berridge PLC

(57) ABSTRACT

An optical system assures excellent optical performance with substantially no effect of birefringence, even when a birefringent crystal material such as fluorite is used. An optical system includes a plurality of crystal optical elements which are formed with crystals belonging to a cubic system. The optical system includes crystal optical elements with a first crystal axis coinciding with the optical axis and crystal optical elements with a second crystal axis, differing from the first crystal axis, coinciding with the optical axis. In order to substantially avoid the effects of birefringence, a predetermined relationship is imposed on a first total evaluation amount $\Sigma Rj$ which is the sum of first evaluation amounts Rj for the plurality of crystal optical elements and a second total evaluation amount $\Sigma Sj$ which is the sum of the second evaluation amounts Sj for the plurality of crystal optical elements for light rays in light beams which are converged on at least one arbitrary point on an image plane or an object plane in the optical system.

31 Claims, 8 Drawing Sheets

U.S. PATENT DOCUMENTS

| | | | |
|---|---|---|---|
| 2003/0000453 A1 | 1/2003 | Unno et al. ...................... 117/1 |
| 2003/0011893 A1 * | 1/2003 | Shiraishi et al. ............ 359/649 |
| 2003/0011896 A1 | 1/2003 | Shiraishi ...................... 359/754 |
| 2003/0012724 A1 | 1/2003 | Burnett et al. ............... 423/464 |
| 2003/0021026 A1 * | 1/2003 | Allan et al. ................. 359/499 |
| 2003/0025894 A1 * | 2/2003 | Owa et al. ..................... 355/67 |
| 2003/0053036 A1 * | 3/2003 | Fujishima et al. ............ 355/53 |
| 2003/0058421 A1 * | 3/2003 | Omura et al. ................. 355/53 |
| 2003/0086156 A1 * | 5/2003 | McGuire, Jr. ............... 359/352 |

* cited by examiner

OPTICAL SYSTEM AND EXPOSURE APPARATUS HAVING THE OPTICAL SYSTEM

This non-provisional application claims the benefit of U.S. Provisional Application No. 60/308,845 filed Aug. 1, 2001. The disclosures of Japanese Priority Application No. 2001-208713 filed Jul. 10, 2001, and Japanese Priority Application No. 2001-214442 filed Jul. 13, 2001, are incorporated herein by reference in their entireties.

BACKGROUND OF THE INVENTION

1. Field of Invention

The present invention relates to an optical system and exposure apparatus having the optical system, and in particular to a projection optical system which is suitable for an exposure apparatus to be used to manufacture microdevices such as semiconductor devices and liquid crystal display devices using photolithography techniques.

2. Description of Related Art

It is known to use a method in which a pattern of a photomask (also called a reticle), which is etched therein by proportionally magnifying, 4–5 fold, the pattern to be formed on an electronic device (a microdevice) such as a semiconductor integrated circuit or a liquid crystal display, is reduced, exposed and formed onto a photosensitive substrate (an exposed substrate) such as a wafer. In this type of projection exposure apparatus, the exposure wavelength continues to shift towards shorter wavelengths in order to cope with the trend toward forming finer semiconductor integrated circuits.

Currently, a KrF excimer laser having an exposure wavelength of 248 nm is mainly used, but ArF excimer lasers with a shorter wavelength of 193 nm are beginning to be commercialized. Moreover, projection exposure apparatus using a light source which provides a beam in the wavelength band of the so-called vacuum ultraviolet region such as $F_2$ laser with 157 nm wavelength, $Kr_2$ laser with 146 nm wavelength and $Ar_2$ laser having 126 nm wavelength are being proposed. Moreover, high resolution through larger numerical aperture (NA) of a projection optical system is being achieved, and development of an optical projection system having a larger numerical aperture, in addition to development of shorter wavelength for exposure, is being conducted.

The availability of optical material (lens material) having an excellent transmission rate and uniform property for exposure beam of short wavelength in the ultraviolet region is limited. In a projection optical system with an ArF excimer laser as a light source, synthetic silica glass may be used as a lens material, but with only one type of lens material, correction of chromatic aberration cannot be achieved sufficiently. Hence, calcium fluoride crystal (fluorite) is used for some of the lenses. On the other hand, in a projection optical system using an $F_2$ laser as a light source, in reality, calcium fluoride crystal (fluorite) is the only lens material suitable for use.

Recently, the existence of intrinsic birefringence in cubic (isometric) system calcium fluoride crystal (fluorite) for such ultraviolet light with short wavelength has been reported. In a super high precision optical system such as a projection optical system used in manufacturing of electronic devices, aberration generated in conjunction with birefringence of the lens material is fatal, and the use of a lens composition and lens design substantially avoiding the effect of birefringence is crucial.

SUMMARY OF THE INVENTION

Considering the aforementioned problems, the present invention aims to assure excellent optical performance substantially without suffering the effect of birefringence even if a crystal material with intrinsic birefringence such as fluorite is used. In addition, the present invention aims to provide a microdevice production method enabling production of high performance microdevices, based on high resolution exposure technology, using an exposure apparatus in which a projection optical system having excellent optical performance utilizing crystal material is provided.

In order to address the aforementioned problems, a first aspect of the present invention provides an optical system having a plurality of crystal optical elements formed with cubic system crystals, wherein the plurality of crystal optical elements comprise first crystal optical elements having a first crystal axis that substantially coincides with an optical axis of the optical system, and second crystal optical elements having a second crystal axis that is different from the first crystal axis, and that is disposed to substantially coincide with the optical axis. The plurality of crystal optical elements Gj are arranged in such a manner that a direction of a predetermined crystal axis in a surface perpendicular to the optical axis is rotated ρj around the optical axis relative to the direction of a predetermined axis in the surface. For a specific light beam passing through the plurality of crystal optical elements Gj, a first evaluation amount Rj for a first predetermined polarization and a second evaluation amount Sj for a second predetermined polarization which are determined by a material constant a of the crystal, the crystal axis substantially coinciding with the optical axis, an angle ρj, an angle θj, an angle Φj and an optical path length Lj are established, where θj is an angle between the specific light beam and the direction of the optical axis, Φj is an angle between the specific light beam and the direction of the predetermined axis, and Lj is the optical path length of the specific optical path. In addition, a first sum of evaluation amounts ΣRj which is a sum of the first evaluation amount Rj for the plurality of crystal optical elements and a second sum of evaluation amounts ΣSj which is a sum of the second evaluation amount Sj for the plurality of crystal optical elements have a predetermined relationship for light beams in imaging beams converged on at least one arbitrary point on an image plane or an object plane of the optical system.

In a preferred embodiment of the first aspect of the invention, the first evaluation amount Rj is information concerning a change in optical path length for the first predetermined polarization, and the second evaluation amount Sj is information concerning a change in optical path length for the second predetermined polarization. In addition, the first predetermined polarization is preferably R polarization having a polarization direction in the radial direction with the center at the optical axis, and the second predetermined polarization is preferably θ polarization having a polarization direction in the tangential direction with the center at the optical axis. Furthermore, the predetermined relationship preferably includes a relationship in which the first sum of evaluation amounts Rj is substantially equal for light beams in imaging beams converged on at least one arbitrary point on the image plane or the object plane of the optical system, the second sum of evaluation amounts ΣSj is substantially equal for light beams in imaging beams converged on at least one arbitrary point on the image plane or the object plane of the optical system, and the first sum of the evaluation amounts Rj and the second sum of the evaluation amounts Sj are substantially equal to each other for light beams in imaging beams converged on at least one arbitrary point on the image plane or the object plane of the optical system.

In a preferred embodiment of the first aspect of the invention, the first evaluation amount Rj and the second evaluation amount Sj are represented by the following equations, and the crystal optical elements Gj are set in such a manner that the optical axis substantially coincides with the crystal axis [111] or a crystal axis optically equivalent thereto, and the predetermined crystal axis is the crystal axis [−110] or a crystal axis optically equivalent thereto:

[Equations 3]

$$Rj = \alpha \times Lj \times [56 \times \{1-\cos(4\theta j)\} - 32\sqrt{2} \times \sin(4\theta j) \times \sin(3\omega j)]/192$$

$$Sj = \alpha \times Lj \times [32 \times \{1-\cos(2\theta j)\} + 64\sqrt{2} \times \sin(2\theta j) \times \sin(3\omega j)]/192,$$

where $\omega j = \Phi j - \rho j$.

In a preferred embodiment of the first aspect of the invention, the first evaluation amount Rj and the second evaluation amount Sj are represented by the following equations, and the crystal optical elements Gj are disposed in such a manner that the optical axis substantially coincides with the crystal axis [001] or a crystal axis optically equivalent thereto, and the predetermined crystal axis is the crystal axis [110] or a crystal axis optically equivalent thereto:

$$Rj = \alpha \times Lj \times \{1-\cos(4\theta j)\} \times (-84-12 \times \cos(4\omega j))/192$$

$$Sj = \alpha \times Lj \times \{1-\cos(2\theta j)\} \times (-48+48 \times \cos(4\omega j))/192$$

where $\omega j = \Phi j - \rho j$.

In a preferred embodiment of the first aspect of the invention, the first evaluation amount Rj and the second evaluation amount Sj are represented by the following equations, and the crystal optical elements Gj are disposed in such a manner that the optical axis substantially coincides with the crystal axis [011] or a crystal axis optically equivalent thereto, and the predetermined crystal axis is the crystal axis [100] or a crystal axis optically equivalent thereto:

[Equations 4]

$$Rj = \alpha \times Lj \times [\{1-\cos(4\theta j)\} \times \{21-9 \times \cos(4\omega j) - 84 \times \cos(2\omega j)\} + 96 \times \cos(2\omega j)]/192$$

$$Sj = \alpha \times Lj \times [\{1-\cos(2\theta j)\} \times \{12+36 \times \cos(4\omega j) + 48 \times \cos(2\omega j)\} - 96 \times \cos(2\omega j)]/192$$

where $\omega j = \Phi j - \rho j$.

In a preferred embodiment of the first aspect of the invention, the material constant a of the crystal is a difference between a refractive index n100 of the light beam having a polarization direction in the direction of the crystal axis [100] or a crystal axis optically equivalent thereto, and a refractive index n011 of the light beam having a polarization direction in the direction of the crystal axis [0-11] or a crystal axis optically equivalent thereto, out of light beams advancing in the direction of the crystal axis [011] or a crystal axis optically equivalent thereto, out of all crystals forming each crystal optical element Gj. In addition, the absolute value of the difference between the first sum of evaluation amounts ΣRj and the second sum of evaluation amounts ΣSj is preferably set to be smaller than λ/2 for light beams in imaging beams converged on at least one arbitrary point on the image plane or the object plane of the optical system, where λ is the wavelength of the light beam.

In a preferred embodiment of the first aspect of the invention, the absolute value of the difference between the first sum of evaluation amounts ΣRj and a predetermined value is preferably set to be smaller than λ/2 for light beams in imaging beams converged on the at least one arbitrary point on the image plane or the object plane of the optical system, where λ is the wavelength of the light beam. In addition, the absolute value of the difference between the second sum of evaluation amounts ΣSj and the predetermined value is preferably set to be smaller than λ/2 for light beams in imaging beams converged on the at least one arbitrary point on the image plane or the object plane of the optical system, where λ is the wavelength of the light beam.

Furthermore, in a preferred embodiment of the first aspect of the invention, the optical system includes M (M is a whole number greater than or equal to 3) crystal optical elements disposed in such a manner that their optical axis substantially coincides with the crystal axis [111] or a crystal axis optically equivalent thereto, and wherein the M crystal optical elements have a rotational position relationship in which the directions of the crystal axis [1-10] or a crystal axis optically equivalent thereto are mutually separated by substantially (120/M) degrees in the surface perpendicular to the optical axis.

Furthermore, in a preferred embodiment of the first aspect of the invention, the optical system includes N (N is a whole number greater than or equal to 3) crystal optical elements disposed in such a manner that their optical axis substantially coincides with the crystal axis [001] or a crystal axis optically equivalent thereto, and wherein the N crystal optical elements have a rotational position relationship in which the directions of the crystal axis [100] or a crystal axis optically equivalent thereto are mutually separated by substantially (90/N) degrees in the surface perpendicular to the optical axis.

In addition, in a preferred embodiment of the first aspect of the invention, the optical system includes L (L is a whole number greater than or equal to 3) crystal optical elements disposed in such a manner that their optical axis substantially coincides with the crystal axis [011] or a crystal axis optically equivalent thereto, and wherein the L crystal optical elements have a rotational position relationship in which the directions of the crystal axis [100] or a crystal axis optically equivalent thereto are mutually separated by substantially (180/L) degrees in the surface perpendicular to the optical axis.

Furthermore, in a preferred embodiment of the first aspect of the invention, the optical system includes P (P is a whole number greater than or equal to 2) crystal optical elements disposed in such a manner that their optical axis substantially coincides with the crystal axis [011] or a crystal axis optically equivalent thereto, and wherein the P optical elements have a rotational position relationship in which the directions of the crystal axis [100] or a crystal axis optically equivalent thereto are mutually separated by substantially (90/P) degrees in the surface perpendicular to the optical axis.

A second aspect of the present invention provides an optical system having a plurality of crystal optical elements formed with cubic system crystals, wherein M (M is a whole number greater than or equal to 3) crystal optical elements are disposed in such a manner that their optical axis substantially coincides with the crystal axis [111] or a crystal axis optically equivalent thereto, and wherein the M crystal optical elements have a rotational position relationship in which the directions of the crystal axis [1-10] or a crystal axis optically equivalent thereto are mutually separated by substantially (120/M) degrees in the surface perpendicular to the optical axis.

A third aspect of the present invention provides an optical system having a plurality of crystal optical elements formed with cubic system crystals, wherein N (N is a whole number greater than or equal to 3) crystal optical elements are disposed in such a manner that their optical axis substantially coincides with the crystal axis [001] or a crystal axis optically equivalent thereto, and wherein the N crystal optical elements have a rotational position relationship in which the directions of the crystal axis [100] or a crystal axis optically equivalent thereto are mutually separated by substantially (90/N) degrees in the surface perpendicular to the optical axis.

A fourth aspect of the present invention provides an optical system having a plurality of crystal optical elements formed with cubic system crystals, wherein L (L is a whole number greater than or equal to 3) crystal optical elements are disposed in such a manner that their optical axis substantially coincides with the crystal axis [011] or a crystal axis optically equivalent thereto, and wherein the L crystal optical elements have a rotational position relationship in which the directions of the crystal axis [100] or a crystal axis optically equivalent thereto are mutually separated by substantially (180/L) degrees in the surface perpendicular to the optical axis.

A fifth aspect of the present invention provides an optical system including P (P is a whole number greater than or equal to 2) crystal optical elements disposed in such a manner that their optical axis substantially coincides with the crystal axis [011] or a crystal axis optically equivalent thereto, and wherein the P crystal optical elements have a rotational position relationship in which the directions of a crystal axis [100] or the crystal axis optically equivalent thereto are mutually separated by substantially (90/P) degrees in the surface perpendicular to the optical axis. In the first–fifth aspects of the invention, each of two or more crystal optical elements are preferably made to possess a rotational error of no more than ±4 degrees, or the angle error between the optical axis and the crystal axis which should coincide with the optical axis of no more than ±4 degrees.

In one preferred embodiment of the first-fifth aspects of the invention, the crystal is preferably either a calcium fluoride crystal or a barium fluoride crystal. In addition, at least one concave surface reflection mirror is preferably provided. Furthermore, optimum aberration correction is preferably executed for the oscillation wavelength of an ArF excimer laser, or for the oscillation wavelength of an $F_2$ laser.

A sixth aspect of the present invention provides an exposure apparatus comprising an illumination system for illuminating a mask and an optical system of the first-fifth aspects of the invention for forming images of a pattern formed on the mask onto a photosensitive substrate.

A seventh aspect of the present invention provides a microdevice production method comprising an exposure step of exposing a pattern of a mask onto a photosensitive substrate using the exposure apparatus of the sixth aspect of the invention, and a development step of developing the exposed photosensitive substrate.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENTS

Hereafter, a description of exemplary embodiments of the present invention will be presented using the attached drawings.

Figure 1:
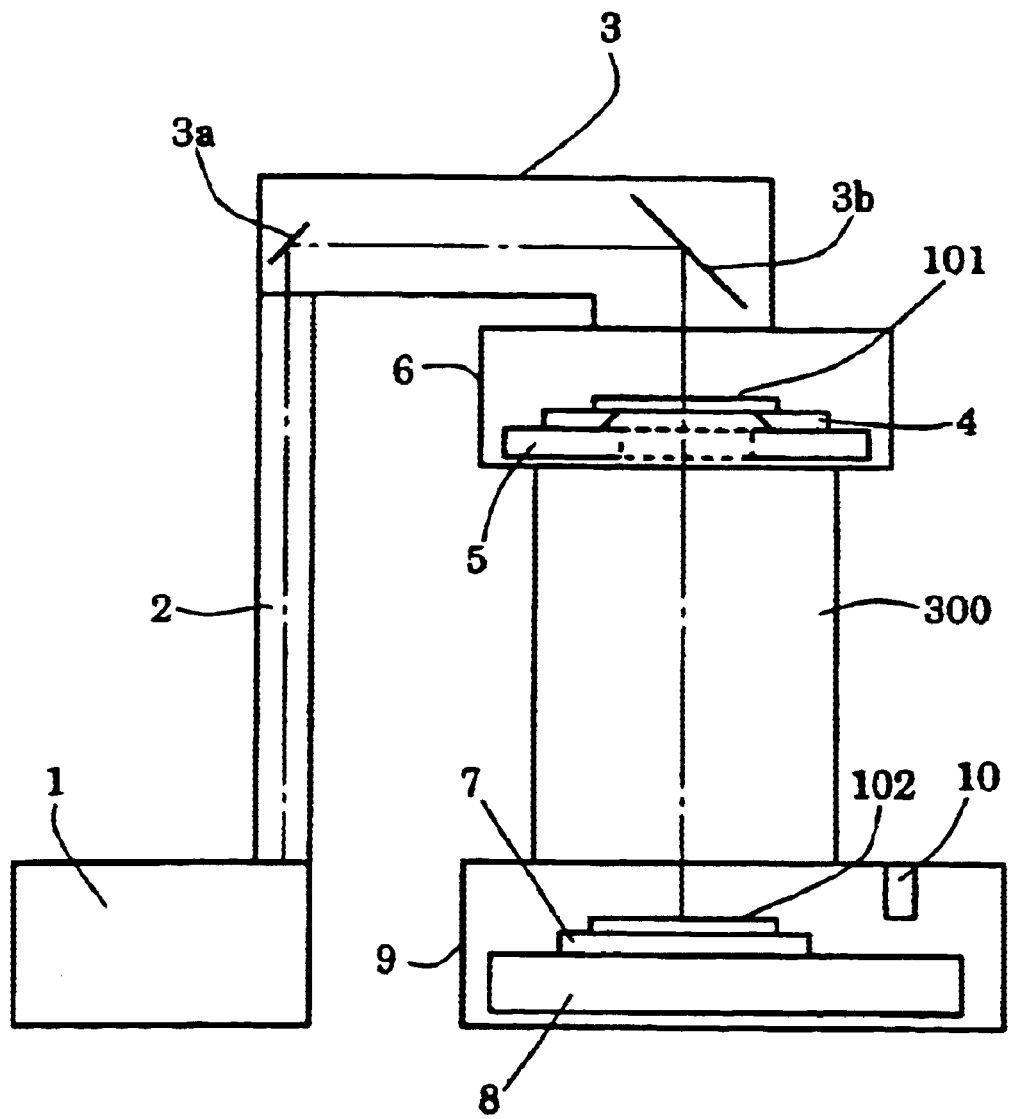
FIG. 1 is a schematic drawing illustrating a structure of an exposure apparatus with a projection optical system of each embodiment of the present invention.

FIG. 1 is a schematic drawing of the structure of an exposure apparatus having a projection optical system according to any of the exemplary embodiments of the present invention. Each embodiment of the present invention can be applied to a projection optical system to be mounted in the exposure apparatus. FIG. 1 shows that the exposure apparatus of each embodiment comprises a light source 1 such as an ArF excimer laser or a $F_2$ laser. Light beams supplied from the light source 1 are guided to the illumination optical system 3 through the light directing system 2. The illumination optical system 3 comprises optical path folding mirrors 3a and 3b, and an unrepresented optical integrator (illumination homogenizing element), and illuminates reticle (mask) 101 substantially uniformly.

Reticle 101 is held by a reticle holder 4 through vacuum suction, and is structured to be movable by operation of reticle stage 5. Light beams passing through the reticle 101 are converged by the projection optical system 300, and form a projected image of a pattern in the reticle 101 onto a photosensitive substrate such as semiconductor wafer 102. Wafer 102 is held by a wafer holder 7 also through vacuum suction, and is structured to be movable by operation of wafer stage 8. By executing batch exposure while moving wafer 102 step by step in this manner, a pattern of the image of reticle 101 is sequentially transferred to each exposure region of the wafer 102.

By executing scanning exposure while moving the reticle 101 and the wafer 102 relative to the projection optical system 300, the pattern of the image of the reticle 101 is sequentially transferred to each exposure region of the wafer 102. Here, in exposing a circuit pattern onto an actual electronic device, it is necessary to perform exposure while accurately positioning the pattern onto the pattern formed during a previous exposure step. Hence, an alignment microscope 10 is mounted in the exposure apparatus for accurately detecting the position of a position detection mark on the wafer 102.

If an $F_2$ laser or an ArF excimer laser (or an $Ar_2$ laser with 126 nm wavelength) is used as the light source 1, the optical path of the light directing system 2, the illumination optical system 3 and the projection optical system 300 are purged by an inert gas such as nitrogen. In particular, if an $F_2$ laser is used, the reticle 101, reticle holder 4 and reticle stage 5 are isolated from outside atmosphere by a casing 6, an internal space of which is also purged with the inert gas. Similarly, the wafer 102, the wafer holder 7 and the wafer stage 8 are isolated from the outer atmosphere by a casing 9, the internal space of which is also purged with the inert gas.

Figure 2:
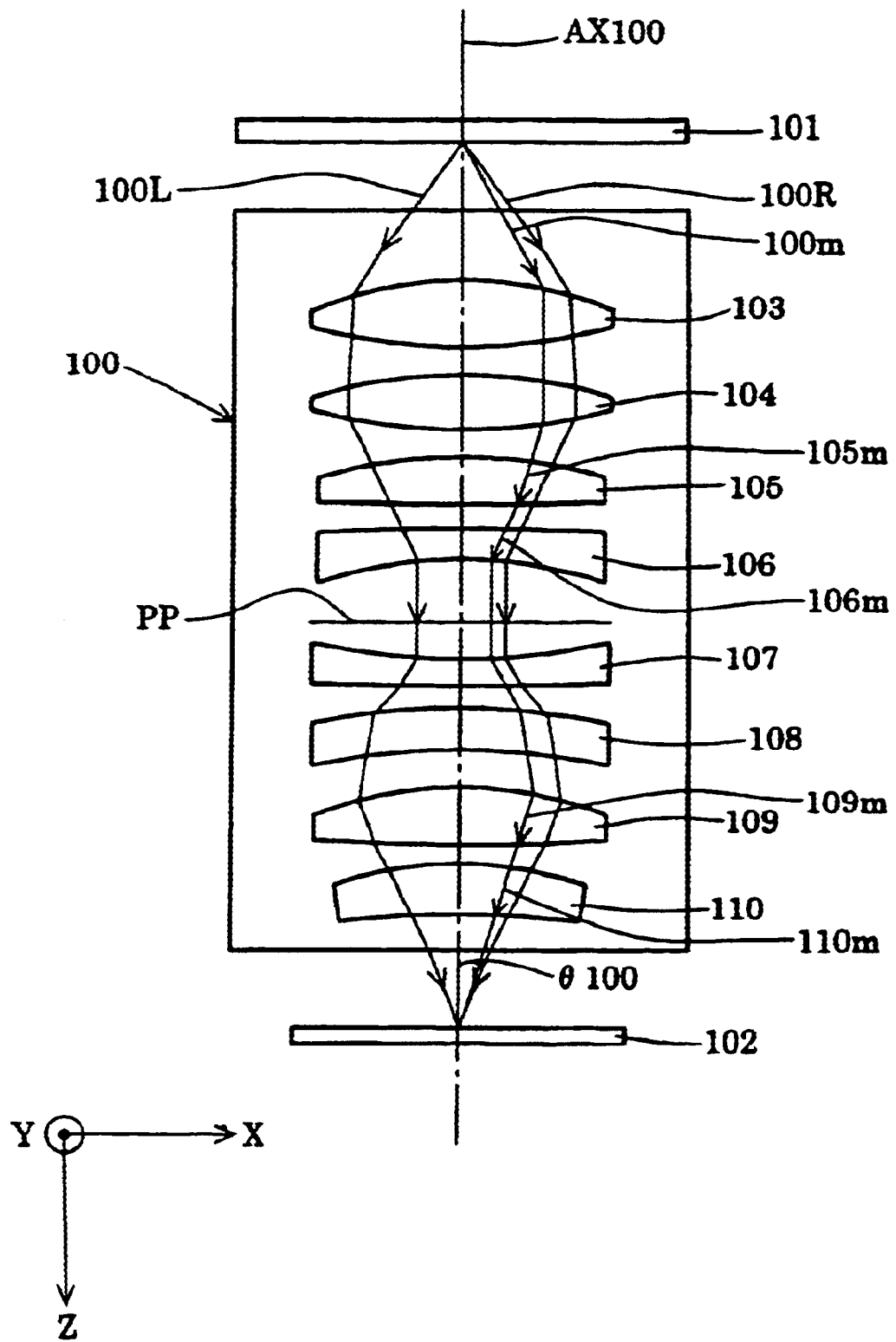
FIG. 2 is a schematic drawing illustrating the structure of the projection optical system of the first embodiment of the present invention.

FIG. 2 is a schematic drawing of the structure of an exposure apparatus having the projection optical system of the first embodiment of the present invention. Here, in FIG. 2, the Z axis is parallel to the optical axis AX100 of the projection optical system 100 (corresponding to the projection system 300 in FIG. 1), the X axis is parallel to the surface of FIG. 2 in a direction perpendicular to the Z axis, and the Y axis is perpendicular to the surface of FIG. 2 in the direction perpendicular to the Z axis. Moreover, the +Z axis direction is downward in the figure, the +X axis direction is to the right in the figure and the +Y axis extends out of the page. The XYZ coordinate system is a right-hand coordinate system (hereafter, simply right-hand system).

In the first embodiment, the present invention is applied to a refractive (dioptric) type projection optical system in which aberration correction is optimized for an ArF laser having a wavelength of 193 nm. In the projection optical system 100, the light beams exiting one point on the reticle 101 are converged on one point on semiconductor wafer 102 as a photosensitive substrate through lenses 103–110 which are arranged along the optical axis AX100. In this manner, an image of the pattern formed on the reticle 101 is projection exposed onto the wafer 102.

In the first embodiment, lenses 105, 106, 109 and 110, out of lenses 103–110, are formed of calcium fluoride crystal (fluorite), while the other lenses are formed of synthetic silica glass. Hereafter, the lenses made of fluorite will be referred to as crystal lenses. Here, the pupil plane PP substantially is a Fourier transformation plane for the reticle 101 and the wafer (photosensitive substrate) 102, and an aperture stop may be arranged on the pupil plane.

As explained before, fluorite displays birefringence for light beams having a short wavelength. However, birefringence (difference in refractive indices between two light beams having mutually perpendicular polarization planes) does not occur in the light advancing in the direction of fluorite crystal axes [100] and [111]. Hence, if the crystal axis or [100] of the crystal lens (crystal optical element) is set to coincide with the optical axis AX100 of the projection optical system 100 (i.e., the optical axis of the crystal lens), the birefringence will not occur for the exposure light advancing parallel to the optical axis AX100. Conversely, with the exposure light advancing along the crystal axis [011], the birefringence amount will be a maximum.

In order to improve the resolution of the projection optical system 100, image side NA (image side numerical aperture), which is a sin function of the maximum incidence angle θ (see FIG. 2) of the light beams onto the wafer 102, should be expanded. For example, the exposure light beams which leave one point on the reticle 101 and which are converged onto the wafer 102 spread (expand) in the region of light beams (region between light beam 100L to 100R in FIG. 2) defined by the maximum incidence angle θ100 onto the wafer 102, and pass through lenses 103–110 which compose (form) the projection optical system 100.

Hence, it is not possible to set the directions of all the arbitrary exposure light rays 100m in the light beams (100L–100R) parallel to the optical axis AX100. In fact, out of arbitrary light rays 100m, the optical path 109m in the crystal lens 109 and the optical path 110m in the crystal lens 110 are not parallel to the optical axis AX100. As a result, the imaging light rays 100m suffer optical path length fluctuation (optical path length change) caused by birefringence of the fluorite crystal.

Other imaging light rays in the imaging beams (100L–100R) also suffer optical path length fluctuation caused by birefringence of the fluorite crystal when the rays pass through the crystal lenses 105, 106, 109 and 110. In this case, because other light rays, in general, have different optical path lengths and an angle with respect to the optical axis AX100 that is different from the light ray 100m in each crystal lens, other light rays will suffer optical path length fluctuation different from that suffered by light ray 100m. The fact that each light ray of the light beams (100L-100R) suffers different optical path length fluctuation causes wavefront aberrations to occur in the beams, which leads to deterioration of resolution performance of the projection optical system 100.

Such birefringence amount is determined accurately from the exposure wavelength λ, the relationship between crystal direction of the fluorite and the direction of advancement of the light beams, and the polarization direction of the light beams. To do this, however, a second-order tensor determined by the crystal direction of fluorite and the direction of light beams and many rotation matrices for rotating the tensor in three dimensional space are needed, resulting in an extremely difficult computation process for indices to be used in optical design. The inventor of the present invention discovered the following more simple formula to compute the aforementioned birefringence amount. Moreover, the inventor discovered that an optical system which suffers substantially no ill effect of birefringence, even when crystal lenses are used, can be designed by executing optical designing that satisfies the formula.

Figure 3:
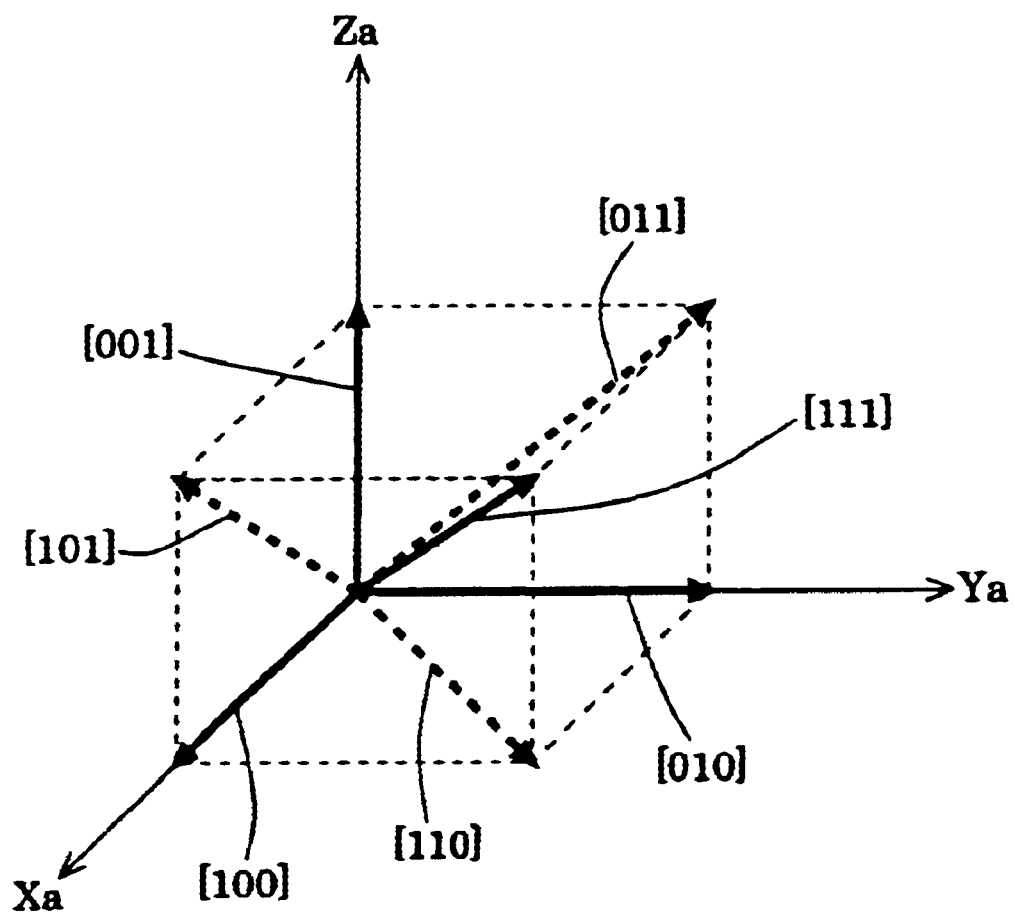
FIG. 3 is a drawing illustrating names and the like of the crystal axes in a cubic crystal such as fluorite.

The formula for computing the aforementioned birefringence differs depending on which crystal axis of the crystal lens is to be made to substantially coincide with the optical axis in the optical system (hereafter also referred to as Z axis). Hence, the names of the crystal axes in cubic system crystals such as fluorite will be explained using FIG. 3. Cubic system refers to a crystal structure in which unit cells of a cube are arranged periodically in the direction of each side of the cube. The sides of the cube are mutually perpendicular, and are denoted by Xa axis, Ya axis and Za axis. In this case, the positive direction of the Xa axis is the direction of crystal axis [100], the positive direction of the Ya axis is the direction of crystal axis [010] and the positive direction of the Za axis is the direction of crystal axis [001].

More generally, when a directional vector (x1, y1, z1) is defined in the aforementioned (Xa, Ya, Za) right-hand coordinate system, the direction of the vector coincides with the crystal axis [x1, y1, z1]. For example, the direction of the crystal axis coincides with the directional vector (1, 1, 1). The direction of the crystal axis [11-2] coincides with the directional vector (1,1,−2). Of course, the Xa axis, the Ya axis and the Za axis are optically and mechanically equivalent to each other in a cubic system crystal, and are indistinguishable in an actual crystal. Moreover, each crystal axis obtained by changing the position and the sign of three numbers such as [011], [0−11] and [110] is completely equivalent (equal) optically and mechanically to each other.

In the present invention, if the relative direction of a crystal axis needs to be strictly defined, a plurality of crystal axes optically equivalent to [011], for example, will be expressed (listed) by changing signs and position such as [011], [0−11] and [110]. However, if the relative direction of a crystal axis does not need to be strictly defined, an expression such as crystal axis [011] is intended to represent the totality of the crystal axes [011], [0−11] and [110] which are optically equivalent. The same definition will apply to the crystal axes such as [001] and [111] in addition to the crystal axis [011].

In the case of an optical system requiring high resolution, crystal axis [001], crystal axis [011] or crystal axis [111] is preferably set to substantially coincide with the optical axis (Z axis). This is because the rotational symmetry relative to the birefringence optical axis may be best set by making this crystal axis coincide with the optical axis. Here, if the crystal axis [001] is set to coincide with the Z axis, crystal axes [100], [010], [110] and [−110] will be disposed in the plane perpendicular to the Z axis. Moreover, if the crystal axis is set to coincide with the Z axis, the crystal axes [100], [−100] and [01−1] will be disposed in the XY plane. Furthermore, if the crystal axis [111] is set to coincide with the Z axis, the crystal axes [1-10] and [11−2] will be disposed in the XY plane.

Hence, no matter which crystal axis, out of the three crystal axes [001], [011] and [111], is set to coincide with the optical axis (Z axis), the degree of freedom relating to rotation of the crystal lens around the optical axis remains, depending on which rotational angle the effect of birefringence will change. In the first embodiment, the crystal axis [001] is set to coincide with the optical axis AX100 of the projection optical system 100 in the crystal lenses 105 and 106. In addition, the crystal axis [111] is set to coincide with the optical axis AX100 of the projection optical system 100 in the crystal lenses 109 and 110.

Figure 4:
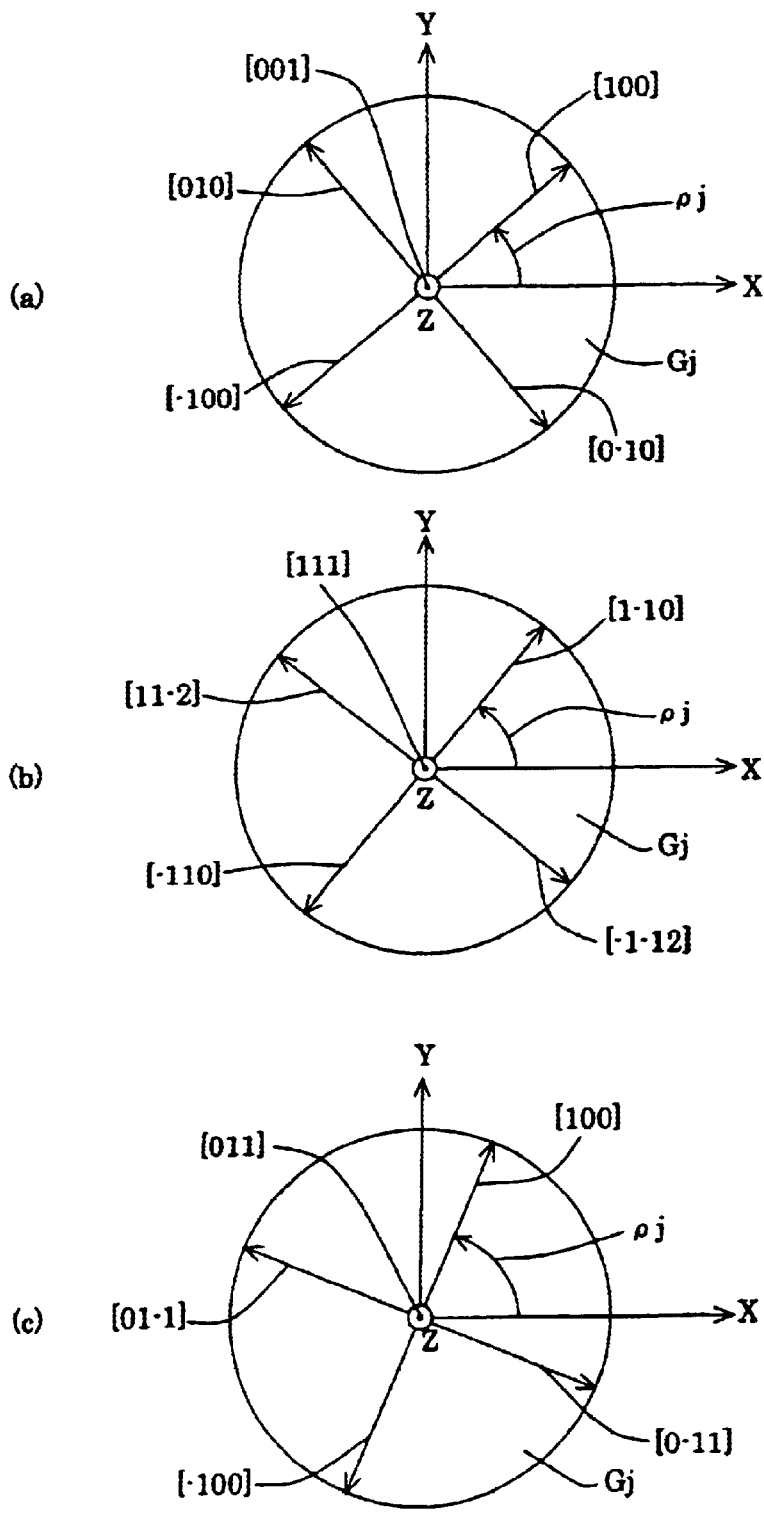
FIG. 4 (FIGS. 4(a)–(c)) illustrate rotational angles around the optical axis in a crystal lens.

FIG. 4 is a drawing explaining the rotational angle around the optical axis of the crystal lens. Here, in FIGS. 4(a), (b), (c), the positive Z axis extends toward the reader and coincides with the optical axis AX100 of the projection optical system 100. FIG. 4(a) shows that for crystal lens Gj, the crystal axis [001] of which coincides with the optical axis (Z axis) (one of crystal lenses 105 and 106), the rotational amount (rotational angle) from the X axis direction to the Y axis direction around the Z axis, which is the crystal axis [100] in the XY plane, is defined to be ρj.

Moreover, FIG. 4(b) shows that for crystal lens Gj, the crystal axis [111] of which coincides with the optical axis (Z axis) (one of crystal lenses 109 and 110), the rotational amount (rotational angle) from the X axis direction to the Y axis direction around the Z axis, which is the crystal axis [1-10] in the XY plane, is defined to be ρj. Furthermore, FIG. 4(c) shows that for crystal lens Gj, the crystal axis [011] of which coincides with the optical axis (Z axis), the rotational amount (rotational angle) from the X axis direction to the Y axis direction around the Z axis, which is the crystal axis [100] in the XY plane, is defined to be ρj, though such crystal lens is not used in the present embodiment.

Figure 5:
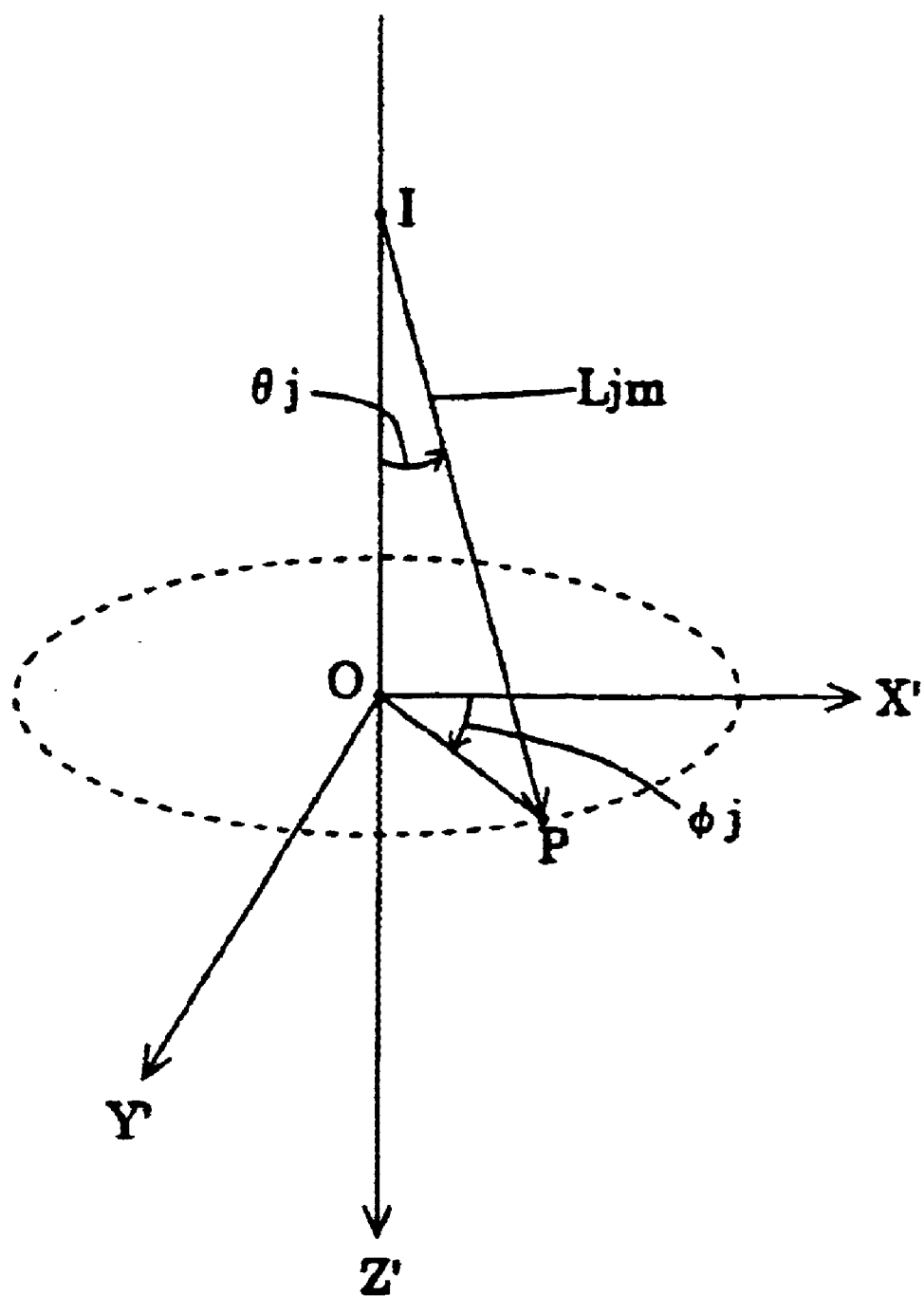
FIG. 5 is a drawing illustrating the angle θ between the light ray and the +Z axis and the angle Φ between the light ray and +X axis in the crystal lens Gj.

FIG. 5 is a drawing explaining the angle θ between the exposure light ray and the Z axis direction, and the angle Φ between the exposure light ray and the X axis direction in the crystal lens Gj. FIG. 5 defines the angle 0 between the light ray (105m, 106m, 109m, 110m) and the z axis direction and the angle Φ between the light ray (105m, 106m, 109m, 110m) and the X axis direction in the crystal lenses Gj (crystal lenses 105, 106, 109, 110). The vector Ljm in FIG. 5 is a directional vector parallel to the exposure optical path (105m, 106m, 109m, 110m) in each crystal lens Gj with a starting point coinciding at point I on the Z' axis. Here, the Z' axis is an axis obtained by parallel shifting the optical axis, the Z axis, to the starting point I of the vector Ljm. Naturally, the direction of the Z' axis is the same as the direction of the Z axis.

The angle between the vector Ljm and the Z' axis will be defined as θ. For the jth crystal lens Gj, this angle becomes θj. Moreover, the position on which the end point P of the vector Ljm intersects the Z' axis is defined as the origin O, and the angle between the line segment from O to the end point P and the X' axis is defined as Φ. In this case also, this angle will be Φj for the jth crystal lens Gj. Here, the X' axis is also an axis obtained by parallel shifting of the X axis, and the direction of the X' axis is the same as the direction of the X axis. As a result, the Y' axis is also the parallel shifted Y axis, and the direction of the Y' axis is the same as the direction of the Y axis.

Hereafter, the polarization having an electric field surface in the plane containing the vector Ljm showing the direction of light beam advancement and the Z' axis will be called "R polarization" and the polarization having an electric field surface in the plane containing the vector Ljm and that is perpendicular to the R polarization plane will be called "θ polarization". More generally, R polarization represents a polarization, the direction of which substantially coincides with the radial direction of a circle having a center at optical axis AX100. In addition, θ polarization represents a polarization, the direction of which substantially coincides with the tangential direction of the circle having its center at the optical axis AX100.

Based on the aforementioned premises, the equations used to compute the birefringence will be described. The evaluation amount representing the effect of birefringence relating to the light beam inside the jth crystal lens Gj comprises the evaluation amount Rj (first evaluation amount) representing refractive index fluctuation amount of R polarization, and the evaluation amount Sj (second evaluation amount) representing refractive index fluctuation amount of θ polarization. Analysis by the inventor of the present invention clarified for the first time that these two evaluation amounts Rj and Sj can be obtained by more simple equations below using the material constant a, the optical path length Lj of each light beam in the crystal lens Gj, the aforementioned three angles θj, Φj and ρj, and the angle parameter ωj(=Φj−ρj).

In short, in the crystal lens (crystal optical element) Gj where the optical axis is set to coincide with crystal axis [111], the first evaluation amount Rj and the second evaluation amount Sj are obtained respectively from the equations (1) and (2) below.

[Equations 5]

$$Rj = a \times Lj \times [56 \times \{1-\cos(4\theta j)\} - 32\sqrt{2} \times \sin(4\theta j) \times \sin(3\omega j)]/192$$

$$Sj = a \times Lj \times [32 \times \{1-\cos(2\theta j)\} \quad (1)$$

$$+ 64\sqrt{2} \times \sin(2\theta j) \times \sin(3\omega j)]/192 \quad (2)$$

Moreover, in the crystal lens (crystal optical element) Gj where the optical axis is set to coincide with crystal axis [001], the first evaluation amount Rj and the second evaluation amount Sj are obtained respectively from the equations (3) and (4) below.

$$Rj = a \times Lj \times \{1-\cos(4\theta j)\} \times (-84 - 12 \times \cos(4\omega j))/192 \quad (3)$$

$$Sj = a \times Lj \times \{1-\cos(2\theta j)\} \times (-48 + 48 \times \cos(4\omega h))/192 \quad (4)$$

Furthermore, in the crystal lens (crystal optical element) Gj where the optical axis is set to coincide with crystal axis [011], the first evaluation amount Rj and the second evaluation amount Sj are obtained respectively from the equations (5) and (6) below.

[Equations 6]

$$Rj = a \times Lj \times [\{1-\cos(4\theta j)\} \times \{21 - 9 \times \cos(4\omega j) - 84 \times \cos(2\omega j)\} + 96 \times \cos(2\omega j)]/192 \quad (5)$$

$$Sj = a \times Lj \times [\{1-\cos(2\theta j)\} \times \{12 + 36 \times \cos(4\omega j) + 48 \times \cos(2\omega j)\} - 96 \times \cos(2\omega j)]/192 \quad (6)$$

The material constant a represents birefringence for the light advancing in the direction of the crystal axis [011] and is a difference between a refractive index n100 of the light beam having a polarization direction (direction of electric field) in the direction of the crystal axis [100] and a refractive index n011 of the light beam having a polarization direction in the direction of the crystal axis [0–11]. If the crystal is fluorite, the material constant a is about $3.6 \times 10^{-7}$ for an ArF laser beam of 157 nm wavelength and is about $6.5 \times 10^{-7}$ for an $F_2$ laser beam of 157 nm wavelength. Optical path length Lj is the length of the exposure optical path (length of the optical path 105*m* and the like) in the crystal lens Gj. Moreover, the terms containing cos and sin thereafter are scalar; hence, the evaluation amounts Rj and Sj represent optical path length change (optical path length information) of the passing light caused by birefringence.

Since a plurality of crystal lenses Gj (four in the present embodiment) are arranged on light ray 100*m* from one point of the reticle 101 to one point on the wafer 102, the evaluation amounts Rj and Sj are obtained for each of the plurality of crystal lenses Gj. Moreover, the first total evaluation amount ΣRj (Σ is a summation symbol denoting sum over j) which is the sum of the first evaluation amounts Rj, and the second total evaluation amount ΣSj which is the sum of second evaluation amounts Sj will be computed. The total evaluation amounts ΣRj and ΣSj become indices representing the total effect of birefringence (optical path length change of passing light due to birefringence) of projection optical system 100 for light ray 100*m*. If the values of the total evaluation amount ΣRj and the total evaluation amount ΣSj are the same, the optical path length change for R polarization and for θ polarization are equal to each other and hence, the respective wavefronts will coincide with each other.

To be more specific, since the crystal axis [001] coincides with the optical axis AX100 in the crystal lenses 105, 106, the optical path length Lj and the aforementioned angles θj and Φj are obtained for imaging optical paths 105*m*, 106*m*. Substituting these values in equations (3), (4), the evaluation amounts Rj and Sj for each crystal lens 105, 106 are computed. Since the crystal axis [111] coincides with the optical axis AX100 in the crystal lenses 109, 110, the optical path length Lj and the aforementioned angles θj and θj are obtained for optical paths 109*m*, 110*m*. Substituting these values in equations (3), (4), the evaluation amounts Rj and Sj for each crystal lens 109, 110 are computed. Then, for all crystal lenses 105, 106, 109 and 110, total evaluation amounts ΣRj and ΣSj, which are sums of the respective evaluation amounts Rj and Sj, are obtained.

In order to compute wavefront aberration, namely optical path length difference between each light ray in the light beams (100L–100R) from one point on the reticle 101 to one point on the wafer 102, ΣRj and ΣSj for each light ray (light rays passing through different positions on pupil surface PP) must be obtained. Moreover, if ΣRj and ΣSj are constant for each light ray, and ΣRj and ΣSj are equal to each other for all the light rays, light beams (100L–100R) will be determined to have no wavefront aberration.

By optimizing the design of the projection optical system 100, namely optimizing lens thickness, radius of curvature, inter-lens distance, and by optimizing the rotational angle of each crystal lens around optical axis to meet the relationship that both ΣRj and ΣSj are constant for each light ray and that ΣRj and ΣSj are equal to each other, an optical system without wavefront aberration due to birefringence may be achieved. However, making ΣRj and ΣSj perfectly constant for all light rays and making ΣRj and ΣSj perfectly equal to each other is extremely difficult.

In actuality, an optical system without ill effect of birefringence may be achieved for practical use, by holding the difference between ΣRj and ΣSj within ½ of the exposure wavelength λ. In other words, an optical system substantially without any ill effect of birefringence may be achieved by making the absolute value of the difference between ΣRj and a predetermined value and the absolute value of the difference between ΣSj and the predetermined value no greater than λ/2 for light rays in the imaging light beams that are converged on at least one arbitrary point on the image plane or the object plane, and by making the absolute value of the difference between ΣRj and ΣSj no greater than λ/2 for light rays in the light beams which are converged on at least one arbitrary point on the image plane or the object plane.

However, this standard value of λ/2 is a tolerance for making the effect on imaging characteristics small assuming very fine patterns (line width=k1×λ/NA) with k1 being a factor having a value of about 0.35. Hence, if the pattern size to be exposed is even smaller, a stricter standard is necessary. For example, if a pattern with a fineness degree of k1 factor of about 0.2 is to be exposed using a phase shift reticle, the difference between ΣRj and ΣSj needs to be held to no greater than 1/20 of the exposure wavelength λ for all the light rays, otherwise excellent imaging characteristics may not be achieved.

In reality, achieving the aforementioned R polarization and θ polarization over the entire surface of light beams (entire pupil surface PP) is a difficult task. However, if only part of the light beams (a part of pupil surface PP) is considered at a time, such R polarization and θ polarization are polarizations which are connected with a transformation relationship in terms of rotational matrices with respect to more practical X polarization and Y polarization. Hence, if R polarization and θ polarization are assumed, an optical system with no wavefront aberration under such polarization conditions will not suffer wavefront aberration for more practical X polarization and Y polarization which are connected to the polarization condition in terms of rotational matrices. Use of evaluation indices based on R polarization and θ polarization will not cause problems as explained above.

Existence of terms containing ωj(=Φj−ρj) in the aforementioned equations (1)–(6), namely terms containing Φj, implies that the effect of birefringence changes with the angle Φj between the light beam and the X axis direction. In other words, the value of these terms may be changed by changing the angle ρj in the angle parameter ωj, or the rotational angle of the crystal lens Gj against the predetermined axis direction.

In a crystal lens which has the crystal axis [111] as an optical axis, Rj and Sj have terms which are proportional to sin(3ωj), which means that the Rj and Sj assume a 3-fold rotational symmetry value relative to lens rotation. This implies that the optical path length change amount which is given in terms of Rj and Sj changes with lens rotation period of 120 degrees. Hence, if two lenses having an optical axis of crystal axis [111] are used, by setting one lens 60 degrees or 180 degrees (=60+120) rotated relative to the other lens around the optical axis, and by setting crystal axis [1-10] of both lenses 60 degrees or 180 degrees away from each other in angle within the XY plane, the 3-fold rotational symmetry component of both lenses are offset, which is very convenient in making ΣRj and ΣSj equal to each other for each light beam.

Similarly, in a crystal lens which has the crystal axis [001] as an optical axis, Rj and Sj have terms which are proportional to cos(4ωj), which means that the Rj and Sj assume a 4-fold rotational symmetry value relative to lens rotation. In this case, Rj and Sj change with a lens rotation period of 90 degrees. Hence, if two lenses having an optical axis of crystal axis [001] are used, by setting one lens 45 degrees or 135 degrees (=45+90) rotated relative to the other lens around the optical axis, and by setting crystal axis [100] of both lenses 45 degrees or 135 degrees away from each other in angle within the XY plane, the 4-fold rotational symmetry component of both lenses are offset, which is very convenient in making $\Sigma Rj$ and $\Sigma Sj$ equal to each other for each light beam.

Moreover, in the crystal lens having crystal axis [011] as the optical axis, Rj and Sj have terms which are proportional to $\cos(4\omega j)$ and $\cos(2\omega j)$. In this case, using four lenses having the crystal axis [011] as the optical axis, and by setting each lens rotated 45 degrees from each other around the optical axis, and respective crystal axis [100] to be separated by 45 degrees each in the XY plane, the rotational asymmetry of each lens is offset, which is very convenient in making $\Sigma Rj$ and $\Sigma Sj$ equal to each other for each light beam.

Of course, the offsetting of the rotational symmetry components using two lenses and four lenses is not limited to application of two lenses and four lenses. Hence, it is obvious that while adjusting rotational angles around the optical axis, thickness, radius of curvature, inter-lens distance of a plurality of crystal lenses, and thickness, radius of curvature and inter-lens distance of other lenses in the system can be set so that the sum $\Sigma Rj$ and the sum $\Sigma Sj$ will be equal to each other.

For example, rotational asymmetry components of birefringence may be offset with three lenses having substantially the same thickness and having the crystal axis [111] as the optical axis. In this case, period of rotational asymmetry of one lens is 120 degrees as explained before. Hence, by setting each lens to have rotational position relationship of 40 degrees from each other around the optical axis, namely, by setting each lens in such a manner that lenses will have a rotational position relationship in which the direction of the crystal axis [1-10] in the surface perpendicular to the optical axis is separated by 40 degrees from each other around the optical axis, the rotational asymmetry of the three lenses will overlap with a position shift of ⅓ of the period respectively.

At this time, the direction of the second lens crystal axis [1-10] will be 40 degrees toward the predetermined direction around the optical axis from a direction of the first lens crystal axis [1-10], and the direction of the third lens crystal axis [1-10] will be 40 degrees toward the same predetermined direction around the optical axis from a direction of the second lens crystal axis [1-10]. In other words, the rotational angle of each lens crystal axis [1-10] is 0 degrees, 40 degrees and 80 degrees measuring from one of the three lenses as a reference (=0 degrees).

If each of the three lenses has weak refractive power and if the direction of light beams in each lens is substantially the same, $\sin(3\omega j)$ in the aforementioned equations (1) and (2) will be expressed by equations (21), (22), (23) below for lenses. Here the unit of argument for sin is a degree.

$$\sin(3\omega 1) \tag{21}$$

$$\sin\{3(\omega 1+40)\}=\sin(3\omega 1+120) \tag{22}$$

$$\sin\{3(\omega 1+80)\}=\sin(3\omega 1+240) \tag{23}$$

Furthermore, the equations (22) and (23) may be changed to the equations (22') and (23') below.

$$\sin(3\omega 1)\times\cos(120)+\cos(3\omega 1)\times\sin(120) \tag{22'}$$

$$\sin(3\omega 1)\times\cos(240)+\cos(3\omega 1)\times\sin(240) \tag{23'}$$

Combining equations (21), (22) and (23) gives the equation (24) below, $$\{1+\cos(120)+\cos(240)\}\times\sin(3\omega 1)+\{\sin(120)+\sin(240)\}\times(\cos 3\omega 1) \tag{24}$$

In the equation (24), both $1+\cos(120)+\cos(240)$ and $\sin(120)+\sin(240)$ are 0. Hence, the value of the sum of equations (21), (22) and (23), or the equation (24) is 0. In short, by setting the three lenses having crystal axis [111] as the optical axis with a rotational position relationship of 40 degrees away from one another around the optical axis, the rotational asymmetry components of birefringence may be eliminated due to offsetting effect. Moreover, use of such three lenses is convenient for making $\Sigma Rj$ and $\Sigma Sj$ equal to each other for each light beam.

Similarly, rotational asymmetry components of birefringence may be offset with three lenses having substantially the same thickness and having the crystal axis [001] as the optical axis. In this case, period of rotational asymmetry of one lens is 90 degrees as explained before. Hence, by setting each lens to have a rotational position relationship of 30 degrees from each other around the optical axis, namely, by setting each lens in such a manner that lenses will have a rotational position relationship in which the direction of the crystal axis [100] in the surface perpendicular to the optical axis is separated by 30 degrees from each other around the optical axis, the rotational asymmetry of the three lenses will overlap with a position shift of ⅓ of the period respectively.

$\cos(4\omega j)$ in the aforementioned equations (3) and (4) will be expressed by equations (31), (32), (33) below for three lenses. Here the unit of argument for cos is a degree.

$$\cos(4\omega 1) \tag{31}$$

$$\cos\{4(\omega 1+30)\}=\cos(4\omega 1+120) \tag{32}$$

$$\cos\{4(\omega 1+60)\}=\sin(4\omega 1+240) \tag{33}$$

Furthermore, the equations (32) and (33) may be changed to the equations (32') and (33') below.

$$\cos(4\omega 1)\times\cos(120)-\sin(4\omega 1)\times\sin(120) \tag{32'}$$

$$\cos(4\omega 1)\times\cos(240)-\sin(4\omega 1)\times\sin(240) \tag{33'}$$

Combining equations (31), (32) and (33) gives the equation (34) below, $$\{1+\cos(120)+\cos(240)\}\times\cos(4\omega 1)-\{\sin(120)+\sin(240)\}\times(\cos 4\omega 1) \tag{34}$$

In the equation (34) both $1+\cos(120)+\cos(240)$ and $\sin(120)+\sin(240)$ are 0. Hence, the value of the sum of equations (31), (32) and (33), or the equation (34) is 0. In short, by setting the three lenses having crystal axis [001] as the optical axis with a rotational position relationship of 30 degrees away from one another around the optical axis, the rotational asymmetry components of birefringence may be eliminated due to offsetting effect. Moreover, the use of such three lenses is convenient for making $\Sigma Rj$ and $\Sigma Sj$ equal to each other for each light beam.

Here, the method of reducing rotational asymmetric birefringence for the lenses having the crystal axis [111] as the optical axis and the lenses having the crystal axis [001] as the optical axis is not limited to the aforementioned methods in which rotational asymmetry components are offset by mutual rotation of two or three lenses. In fact, the aforementioned method may be generalized to a case in which the crystal lens having rotational asymmetry of period β degrees. In this case, using Q (a whole number greater than or equal to 2) crystal lenses with a rotational position relationship of (β/G) degrees away from each other around the optical axis, the rotational asymmetry component of birefringence may be eliminated by offsetting effect.

In other words, if M (an arbitrary whole number greater than or equal to 3) lenses having the crystal axis [111] as the optical axis are used, by setting the M lenses with a rotational position relationship of (120/M) degrees away from each other around the optical axis, the rotational asymmetry component of birefringence may be eliminated by the offsetting effect. To be more specific, if five lenses having the crystal axis [111] as the optical axis are used, by setting the five lenses with a rotational position relationship of being 24 (=120/5) degrees away from each other around the optical axis, the rotational asymmetry component of birefringence may be eliminated by the offsetting effect.

Moreover, if N (an arbitrary whole number greater than or equal to 3) lenses having the crystal axis [001] as the optical axis are used, by setting the N lenses with a rotational position relationship of (90/N) degrees away from each other around the optical axis, the rotational asymmetry component of birefringence may be eliminated by the offsetting effect. To be more specific, if six lenses having the crystal axis [001] as the optical axis are used, by setting the six lenses with a rotational position relationship of 15 (=90/6) degrees away from each other around the optical axis, the rotational asymmetry component of birefringence may be eliminated by the offsetting effect.

It is obvious here that the rotational angle of each crystal lens may be the sum of each of (120/M, 90/N) and the rotational asymmetry period β, as in the case of the aforementioned embodiment. In general, two lenses may be used to offset rotational asymmetry component of birefringence, but the aforementioned method allows use of more than two arbitrary lenses to offset rotational asymmetry component of birefringence. Hence, the use of three lenses is more convenient than two lenses because of less restriction in lens design. In fact, a lens group comprising such a large number of lenses may also be used to make $\Sigma R_j$ and $\Sigma S_j$ equal to each other for each light beam. As explained above, the aforementioned offsetting effect is most effective when the refractive power of each lens is weak and the direction of light beams in each lens is substantially uniform, but obviously, the aforementioned offsetting effect may be achieved in other cases as well.

Now, in the crystal lens having crystal axis [011] as the optical axis, $R_j$ and $S_j$ have terms which are proportional to $\cos(4\omega_j)$ and $\cos(2\omega_j)$ as rotational asymmetry terms, which is shown by equations (5) and (6). Of these two terms, the term proportional to $\cos(2\omega_j)$ is a component having 180 degrees as the rotational period. Hence, the rotational asymmetry component may be offset by arranging two lenses with substantially the same thickness having the crystal axis [011] as the optical axis with rotation of 90 degrees from each other around the optical axis (two lens groups with 90 degrees rotation), as explained above. Furthermore, similar consideration as above enables offsetting of birefringence rotational asymmetry component using three lenses with substantially the same thickness having the crystal axis [011] as the optical axis. In this case, birefringence rotational asymmetry component may be offset by setting the three lenses 60 degrees away from each other around the optical axis, namely by setting the three lenses in such a manner that the direction of crystal axis [100] in the plane perpendicular to the optical axis will have a positional relationship of being 60 degrees away from each other around the optical axis (three lenses with 60 degrees rotation).

More generally, in order to eliminate a rotational asymmetry term proportional to $\cos(2\omega_j)$, L (an arbitrary whole number greater than or equal to 3) crystal lenses having the crystal axis [011] as the optical axis may be set in such a manner that the L lenses will have a rotational position relationship of being (180/L) degrees away from each other around the optical axis. In this method, the number of lenses to offset a rotational asymmetry term proportional to cos $(2\omega_j)$ in the lenses having the crystal axis [011] as the optical axis may be selected arbitrarily, which will conveniently reduce restriction in designing the lenses.

Hence, the rotational asymmetry component term proportional to $\cos(4\omega_j)$ may be offset by using two lenses which are rotated 45 degrees from each other around the optical axis, as in the case of the lenses having the crystal axis [001] as the optical axis. Furthermore, similar consideration as above enables offsetting of birefringence rotational asymmetry component using three lenses with substantially the same thickness having the crystal axis [011] as the optical axis. In this case, birefringence rotational asymmetry component may be offset by setting three lenses 30 degrees away from each other around the optical axis, namely by setting the three lenses in such a manner that the direction of crystal axis [100] in the plane perpendicular to the optical axis will have a positional relationship of being 30 degrees away from each other around the optical axis (three lenses with 30 degrees rotation).

More generally, in order to eliminate a rotational asymmetry term proportional to $\cos(4\omega_j)$, P (an arbitrary whole number greater than or equal to 2) crystal lenses having the crystal axis [011] as the optical axis may be set in such a manner that the P lenses will have a rotational position relationship of being (90/P) degrees away from each other around the optical axis. In this method, the number of lenses to offset rotational asymmetry term proportional to $\cos(4\omega_j)$ in the lenses having the crystal axis [011] as the optical axis may be selected arbitrarily, which will conveniently reduce restriction in designing lenses.

Here, in the case of lenses having the crystal axis [011] as the optical axis, rotation asymmetry components proportional to $\cos(2\omega_j)$ are offset, hence, at least P sets of lens groups comprising the aforementioned L lenses or two lenses to be arranged close to each other along the optical axis are prepared. Moreover, the term proportional to cos $(4\omega_j)$ is preferably eliminated by giving (90/P) degrees of relative rotation around the optical axis to each lens group. In this method also, the number of lens groups to be used to offset the rotation asymmetry term proportional to $\cos(4\omega_j)$ is not limited to two, and more than two groups may be used, which conveniently reduces restriction in designing lenses. Here, in the present embodiment, the number of lenses to be used for offsetting the birefringence rotation asymmetry component may be two, but because the aforementioned method enables the use of any number of lenses, using more than two lenses, which has less restriction in designing lenses than using two lenses, is preferable.

As explained above, in eliminating the effect of birefringence through rotation of a plurality of lenses around the optical axis, the rotational direction of each lens of the plurality of lenses is preferably held within ±4 degrees of the aforementioned predetermined angle. If the setting error of the rotational angle becomes larger than the tolerance value, the birefringence elimination effect of the present invention declines, which leads to a problem of deterioration of imaging performance due to residual birefringence. Moreover, directional error of a designated crystal axis which substantially coincides with the optical axis from the optical axis is preferably within ±4 degrees. If the angle setting error of the designated crystal axis and the optical axis becomes larger than the tolerance value, a problem of deterioration of imaging performance occurs due to residual birefringence, as in the aforementioned case.

This is the same in the case when a lens group includes more than two lenses to eliminate birefringence, or in the case when a lens group includes two lenses to eliminate birefringence. However, this angle error range of within ±4 degrees is a tolerance angle error range assuming a very fine pattern (line width=k1×λ/NA) with the k1 factor being about 0.35. Hence, if the pattern size to be transferred is even smaller, the directional error between the aforementioned designated crystal axis and the optical axis must be made smaller than the angle error range. For example, if a pattern with a fineness degree of k1 factor of about 0.2 is to be exposed using a phase shift reticle, these angle error ranges are preferably made no more than 12 degrees.

Conversely, if an optical system deals with patterns having a k1 factor=0.5 or so, these angle errors may be eased to about ±6 degrees and still achieve sufficient imaging performance. In order to strictly control the direction of the crystal axis in this manner, a crystal axis direction verification method, i.e., a method in which an X ray with a wavelength close to the lattice constant of the crystal may be irradiated on the crystal and its diffractive patterns measured during a production step of the crystal material for the crystal lens, and a processing step (grinding and polishing) of the crystal lens, to verify crystal axis direction is preferably used.

Here, if the lens group having the same crystal axis as the optical axis is mutually rotated around the optical axis to offset and eliminate these rotational asymmetry components as explained above, and if the offsetting is complete, then only the terms without $\omega j$ in equations (1)–(6) will have an effect on $\Sigma Rj$ and $\Sigma Sj$.

If only the terms without $\omega j$ are to have an effect in the crystal lens Gj which is set to have the optical axis and the crystal axis [111] to coincide, the first evaluation amount $Rj'$ and the second evaluation amount $Sj'$ will be represented by equations (7) and (8) below.

$$Rj' = \alpha \times Lj \times 56 \times \{1-\cos(4\theta j)\}/192 \quad (7)$$

$$Sj' = \alpha \times Lj \times 32 \times \{1-\cos(2\theta j)\}/192 \quad (8)$$

Moreover, if only the terms without $\omega j$ are to have an effect in the crystal lens Gj which is set to have the optical axis and the crystal axis [001] to coincide, the first evaluation amount $Rj'$ and the second evaluation amount $Sj'$ will be represented by equations (9) and (10) below.

$$Rj' = \alpha \times Lj \times (-84) \times \{1-\cos(4\theta j)\}/192 \quad (9)$$

$$Sj' = \alpha \times Lj \times (-48) \times \{1-\cos(2\theta j)\}/192 \quad (10)$$

Moreover, if only the terms without $\omega j$ are to have an effect in the crystal lens Gj which is set to have the optical axis and the crystal axis [011] to coincide, the first evaluation amount $Rj'$ and the second evaluation amount $Sj'$ will be represented by equations (11) and (12) below.

$$Rj' = \alpha \times Lj \times 21 \times \{1-\cos(4\theta j)\}/192 \quad (11)$$

$$Sj' = \alpha \times Lj \times 12 \times \{1-\cos(2\theta j)\}/192 \quad (12)$$

No matter which crystal axis is made to be the optical axis above, the coefficient of the term containing $\{1-\cos(4\theta j)\}$ in $Rj'$ and the term containing $\{1-\cos(2\theta j)\}$ in $Sj'$ satisfies the proportional relationship of 7:4. Moreover, $Rj'$ values and $Sj'$ values of the crystal lens having the crystal axis [111] as the optical axis, $Rj'$ values and $Sj'$ values of the crystal lens having the crystal axis [001] as the optical axis, and $Rj'$ values and $Sj'$ values of the crystal lens having the crystal axis [011] as the optical axis satisfy the proportional relationship of 8:–12:3.

Hence, in offsetting the rotational asymmetry component by mutually rotating lens groups having the same crystal axis as the optical axis around the optical axis, if the sum $\Sigma L111$ of the optical path length in the lens group having the crystal axis [111] as the optical axis, the sum $\Sigma L001$ of the optical path length in the lens group having the crystal axis [001] as the optical axis, and the sum $\Sigma L011$ of the optical path length in the lens group having the crystal axis [011] as the optical axis satisfy the equation (13) below, then both $\Sigma Rj$ and $\Sigma Sj$ become 0.

$$8 \times \Sigma L111 - 12 \times \Sigma L001 + 3 \times \Sigma L011 = 0 \quad (13)$$

The projection optical system 100 of the first embodiment includes the crystal lenses (105, 106) having the crystal axis [001] as the optical axis and the crystal lenses (109, 110) having the crystal axis [111] as the optical axis, but does not include crystal lenses having the crystal axis [011] as the optical axis. Hence, the crystal lens 105 and the crystal lens 106 are made to have substantially the same thickness and are rotated 45 degrees or 135 degrees relative to each other around the optical axis. Moreover, the crystal lens 109 and the crystal lens 110 are made to have substantially the same thickness and are rotated 60 degrees or 180 degrees relative to each other around the optical axis.

Moreover, in offsetting the rotational asymmetry component of birefringence between the lens group (105, 106) having the crystal axis [001] as the optical axis and the lens group (109, 110) having the crystal axis [111] as the optical axis, if the sum $\Sigma L001$ of the optical path length of the imaging optical paths 105m and 106m and the sum $\Sigma L111$ of the optical path length of the imaging optical paths 109m and 110m satisfy the equation (14) below, then both $\Sigma Rj$ and $\Sigma Sj$ become 0.

$$8 \times \Sigma L111 - 12 \times \Sigma L001 = 0 \quad (14)$$

In short, by setting the ratio of the total thickness of the crystal lenses 105 and 106 to the total thickness of the crystal lenses 109 and 110 to roughly 2:3, the effect of the birefringence may be minimized. In the aforementioned example, both $\Sigma Rj$ and $\Sigma Sj$ for each light ray in the light beams are equal to 0. However, it is not always necessary to make both $\Sigma Rj$ and $\Sigma Sj$ equal to 0, but it is sufficient to make $\Sigma Rj$ and $\Sigma Sj$ substantially equal to a predetermined value for each light ray. Moreover, a difference between $\Sigma Rj$ and $\Sigma Sj$ centering around the predetermined value should be made within the range of $\lambda/2$ or $\lambda/20$, for example, by setting the crystal axis, rotational angle $\rho j$ of each crystal lens and the thickness, radius of curvature and the inter-lens distance of all the lenses, an optical system with minimum ill effect of birefringence may be achieved.

It is obvious that a method in which the total ill effect of birefringence of the optical system is eliminated through a combination of lens groups with offsetting respective rotational asymmetry as in the case of the first embodiment above, is only one example of the methods to reduce ill effects of the birefringence in the present invention. In fact, not only the aforementioned method in which rotational lens groups are combined, but also any method in which the entire optical system is set in a manner such that the first total evaluation amount $\Sigma Rj$ and the second total evaluation amount ΣSj are equal to each other for light beams converged on an arbitrary point on the image plane or the object plane may be used.

Figure 6:
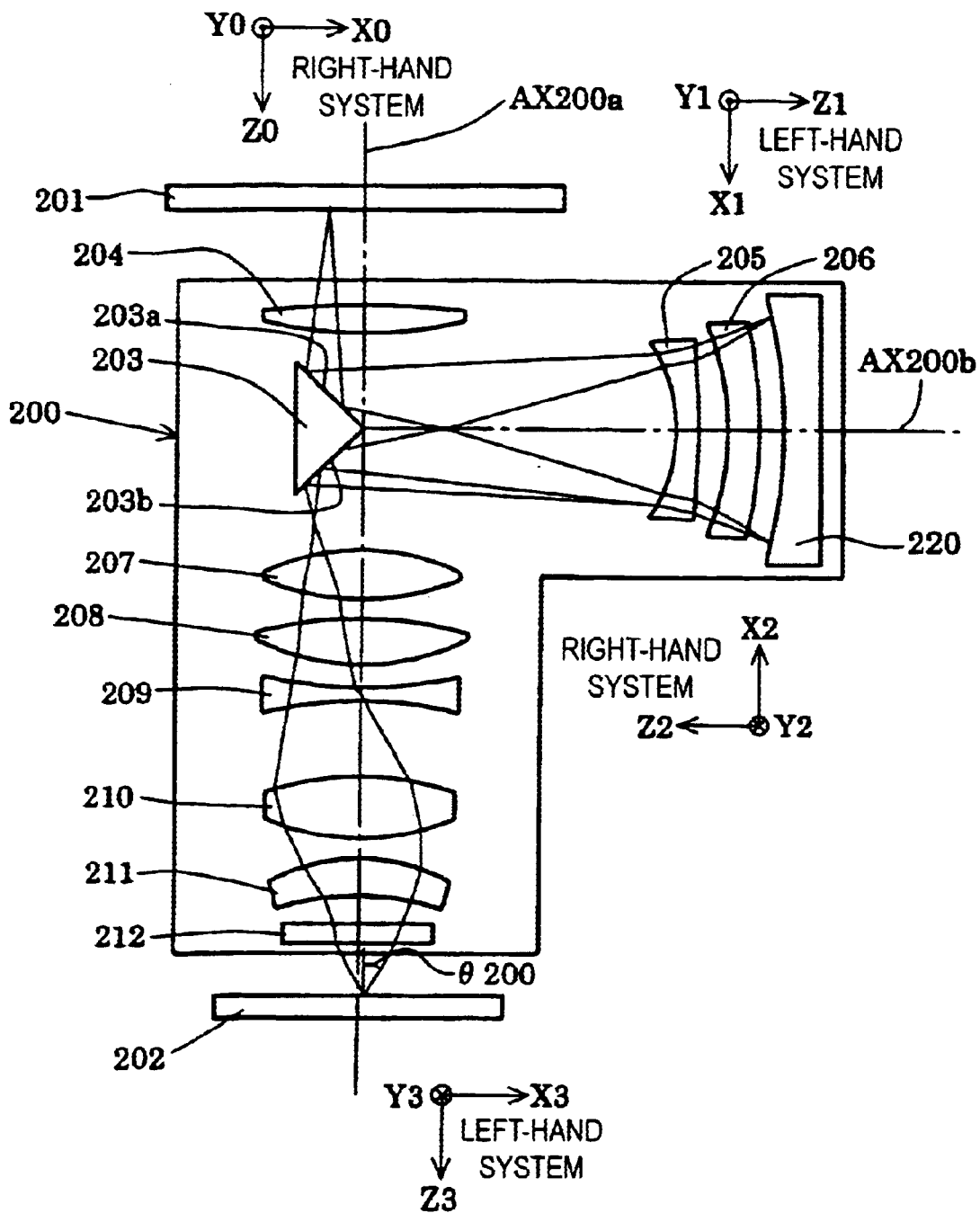
FIG. 6 is a schematic drawing illustrating the structure of the projection optical system of the second embodiment of the present invention.

FIG. 6 is a schematic drawing of the structure of a projection optical system of a second embodiment of the present invention. In the second embodiment, the present invention is applied to a catadioptric type projection optical system in which aberration correction is optimized for an $F_2$ laser of 157 nm wavelength. In the projection optical system 200 (corresponding to the projection optical system 300 in FIG. 1) of the second embodiment, the light beam exiting one point on the reticle 201 (corresponding to the reticle 101 in FIG. 1) is incident on a mirror block 203, functioning as an optical path changing means, through lens 204 which is arranged along the optical axis AX200a.

The light beam reflected by a plane mirror 203a of the mirror block 203 is incident on a concave surface reflection mirror 220 through lenses 205 and 206 that are arranged along the optical axis AX200b. The light beam reflected by the concave surface reflection mirror 220 re-enters the mirror block 203 through lenses 206 and 205. The light beam reflected by the plane mirror 203b of the mirror block 203 converges at one point on the wafer 202 (corresponding to the wafer 102 in FIG. 1) through lenses 207–212 which are arranged along the optical axis AX200a. In this manner, the image on reticle 201 is projected onto the wafer 202. In the second embodiment, all the lenses 204–212 are made of calcium fluoride crystal (fluorite).

In such a catadioptric optical system, the effect of birefringence of a projection optical system may be computed using evaluation amounts ΣRj and ΣSj of the present invention, and the ill effects of birefringence of the projection optical system 200 may be minimized by adjusting the evaluation amounts ΣRj and ΣSj of the present invention. However, the catadioptric optical system of the second embodiment differs from the optical system of the first embodiment in that some of crystal lenses are arranged on an optical axis different from other crystal lenses, the direction of the X axis, which is a standard for rotational angle around the optical axis of each crystal lens, may change due to a reflection effect of the plane mirrors 203a and 203b, and in that the imaging optical path for the crystal lenses 205 and 206 are bi-directional in the lenses.

Hereafter, setting of the XYZ axes in the catadioptric type projection optical system 200 will be described. First, FIG. 6 illustrates that X0Y0Z0 coordinate system is established for the crystal lens 204, which is arranged along the optical axis AX200a in the vicinity of reticle 201 as in the case of the first embodiment. Downward along the optical axis AX200a which is the direction of advancement of exposure light is set as a direction of the +Z0 axis, toward the right in the page of FIG. 6 is set as the +X0 axis, and the toward the reader on the page is set as the +Y0 direction. In this case, the X0Y0Z0 coordinate system is a right-hand system. In this manner, the aforementioned angles θj, ρj and Φj are computed based on the X0Y0Z0 coordinate system for the crystal lens 204, which will be substituted in equations (1)–(6) to obtain evaluation amounts Rj and Sj.

Next, when the imaging light beam is reflected by the plane mirror 203a, the direction of the light beam changes to the right in the figure, hence an X1Y1Z1 coordinate system will be established with the new direction of the light beam being defined as the +Z1 axis. In this case, the X1Y1Z1 coordinate system is transformed to a left-hand coordinate system (hereafter left-hand system) by reflection effect of the plane mirror 203a. In short, the X1Y1Z1 coordinate system is established in such a manner that the +Z1 axis is toward right along the optical axis AX200b, which is the direction of advancement of the exposure light, the +X1 axis is downward in the figure and the +Y1 axis is toward the reader on the page. In this manner, the aforementioned angles θj, ρj and Φj are computed based on the X1Y1Z1 coordinate system for a light beam passing through the crystal lenses 205 and 208 to right, which will be substituted in equations (1)–(6) to obtain evaluation amounts Rj and Sj.

In this case, however, because the X1Y1Z1 coordinate system is a left-hand system, special attention should be paid in determining the signs of the angles ρj and Φj in FIG. 5. In other words, in the case of the X1Y1Z1 coordinate system, which is a left-hand system, if the X axis, the Z axis and the X' axis, the Z' axis are fixed to be consistent with FIG. 4 and FIG. 5, the direction of the Y axis and the Y' axis become opposite to the direction in FIG. 4 and FIG. 5. Because the rotational angles ρj and Φj are defined in such a manner that the rotational angle from the X axis (X' axis) to the Y axis (Y' axis) is positive, the positive direction of rotation in the X1Y1Z1 coordinate system, which is a left-hand system, becomes opposite of the positive direction in FIG. 4 and FIG. 5. However, the rotational direction from the X1 axis to the Y1 axis is still positive.

Next, when the light beam is reflected by the concave mirror 220, the direction of the light beam changes to the left in the figure, hence the X2Y2Z2 coordinate system will be established with the new direction of the light beam being defined as the +Z2 axis. In this case, the X2Y2Z2 coordinate system is transformed to a right-hand coordinate system again by the reflection effect of the concave mirror 220. In short, the X2Y2Z2 coordinate system is established in such a manner that the +Z2 axis is toward the left along the optical axis AX200b, which is the direction of advancement of the exposure light, the +X2 axis is upward in the figure and the +Y2 axis is away from the reader on the page. In this manner, the aforementioned angles θj, ρj and Φj are computed based on the X2Y2Z2 coordinate system for a light beam passing through the crystal lenses 205 and 206 to the left, which will be substituted in equations (1)–(6) to obtain evaluation amounts Rj and Sj.

Here, in the crystal lenses 205 and 206, the crystal axis [001] (or crystal axis [111], [011]) is made to coincide with the direction of advancement of the light beams, and attention should be paid to the fact that signs of the various crystal axis will reverse depending on whether the light beams advance to the left or to the right in the crystal lenses 205 and 206. In other words, the crystal axis which would be [111] when the light beams advance to the left will change to the crystal axis [−1−1−1] when the beams advance to the right. Similarly, the crystal axis [100] becomes the crystal axis [−100] and the crystal axis [110] becomes the crystal axis [−110].

Finally, when the imaging light beams are reflected by the plane mirror 203b, the light beams advance downward in the figure, hence, the X3Y3Z3 coordinate system is set with the +Z axis being defined to this direction of the light beams. In this case, the X3Y3Z3 coordinate system is transformed again to a left-hand system due to the effect of the reflection by the plane mirror 203b. In other words, the +Z3 axis is defined to be downward along the optical axis AX200a, the direction of the advancement of the exposure light, the +X3 axis is defined to be right and the +Y3 axis to be away from the reader on the page. In this manner, the aforementioned angles θj, ρj and Φj are computed based on the X3Y3Z3 coordinate system for crystal lenses 207–212, which will be substituted in equations (1)–(6) to obtain evaluation amounts Rj and Sj Here, because the X3Y3Z3 coordinate system is a left-hand system, the method of computing angles ρj and Φj will be the same as the case in which the light beams pass through the crystal lenses 205, 206 to the right.

The total evaluation amounts ΣRj and ΣSj which are obtained by adding respective evaluation amounts Rj and Sj for each crystal lens obtained above may be used as indices for a degree of effect of birefringence in the catadioptric type projection optical system as in the case of refractive projection optical system 100 in the first embodiment. Moreover, an optical system in which the ill effects of birefringence are minimized may be achieved by setting the crystal axis of each crystal lens, the rotational angle ρj, thickness, radius of curvature and inter-lens distances of all the lenses in such a manner that the difference of the total evaluation amounts ΣRj and ΣSj from a predetermined value, for all light rays in the light beams exiting one point on reticle 201 and converging on one point on wafer 202, are within the range of $\lambda/2$ or $\lambda/20$, for example, as in the case of the refractive type projection optical system of the first embodiment.

Here, for the crystal lenses 205, 206 to be arranged in the vicinity of the concave reflection mirror 220 in the projection optical system 200 of the second embodiment, the fluorite crystal axis [111] is made to coincide with the optical axis AX200b, and the crystal axis [1-10] is arranged to be rotated 60 degrees or 180 degrees from each other around the optical axis. Moreover, for crystal lenses 204, 207, 208 and 209, the fluorite crystal axis is made to coincide with the optical axis AX200a and the crystal axis [100] is arranged to be rotated 45 degrees from each other around the optical axis.

Moreover, for crystal lenses 211 and 212, the fluorite crystal axis [001] is made to coincide with the optical axis AX200a and the direction of the crystal axis [100] is arranged to coincide with each other. Furthermore, for crystal lens 210, the fluorite crystal axis [001] is made to coincide with the optical axis AX200a and the direction of the crystal axis [100] is arranged to be rotated 45 degrees or 135 degrees from the direction of the crystal axis [100] of the crystal lenses 211, 212. In this manner, setting of the total evaluation amounts ΣRj and ΣSj within the predetermined range becomes easy for all light rays in the light beams exiting one point on reticle 201 and converging on one point on wafer 202.

The first and second embodiments mention only the light beams exiting one point on reticle 101 (201) for the sake of simplicity of explanation of the present invention. However, it is obvious that the aforementioned relationship of the present invention must be satisfied for all the beams exiting from all the points in the effective illumination areas on reticle 101 (201) reaching effective exposure area on wafer 102 (202), in order to obtain excellent imaging performance.

Moreover, in each of the aforementioned embodiments, calcium fluoride crystal (fluorite) is used as an optical material with birefringence, but other single axis crystal materials such as barium fluoride ($BaF_2$) crystal, lithium fluoride (LiF) crystal, sodium fluoride crystal (NaF), strontium fluoride ($SrF_2$) crystal and beryllium fluoride ($BeF_2$) crystal, which are transmissive of vacuum ultraviolet light may be used. Of these, barium fluoride crystal is most promising as a lens material, because large crystals having a diameter larger than 200 mm have been developed.

In each of the aforementioned embodiments, the present invention is applied to a projection optical system, but the present invention may be applied to an optical system for inspecting a projection optical system such as an aberration measurement optical system. Moreover, depending on the type of optical system for which the present invention is applied, the structure of the optical system may change to the optical system from the object plane to the pupil plane or the optical system in which parallel light beams are converged on the image plane, instead of the optical system in which an image is formed from the object plane to the image plane in the case of the aforementioned embodiments. In this case, light beams exiting at one point on reticle 101 (201) reaching one point on wafer 102 (202) will not exist, unlike the case of the aforementioned embodiments, but it is obvious that the present invention may be applied as in the case of the aforementioned embodiments by interpreting such light beams as light beams exiting from one point on the object plane reaching the pupil plane, or converging on one point in the image plane.

In the exposure apparatus of each of the aforementioned embodiments, microdevices (semiconductor devices, image pickup elements, liquid crystal elements, thin film magnetic heads, and the like) may be produced by illuminating a mask (reticle) using an illumination apparatus (illumination step) and by transferring patterns formed on the mask onto a photosensitive substrate using the projection optical system (exposure step). Hereafter, a method of obtaining a semiconductor device, as an example of a microdevice, through formation of a predetermined circuit pattern onto wafer and the like, as an example of a photosensitive substrate, using an exposure apparatus of each of the embodiments will be explained referring to the flowchart of FIG. 7.

Figure 7:
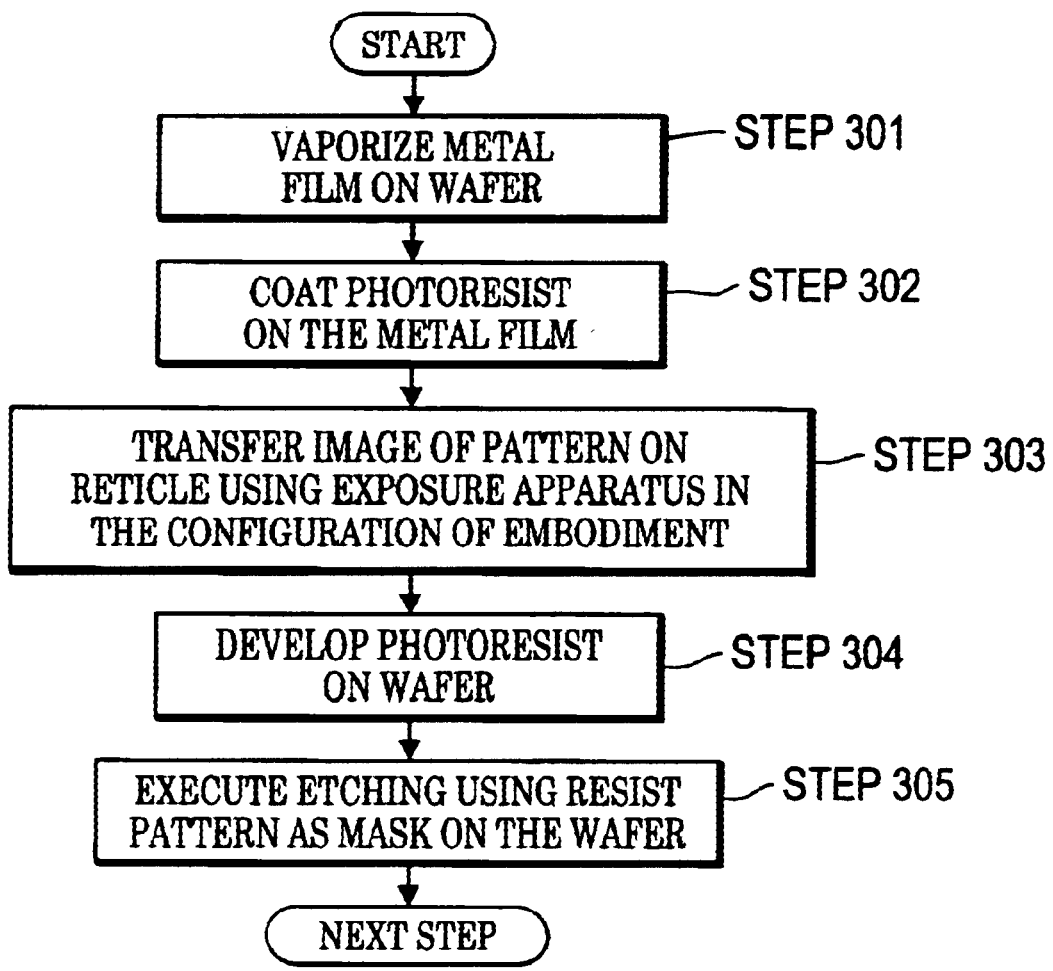
FIG. 7 is a flow chart illustrating a method of producing a semiconductor device as an example of microdevice.

First, at step 301 in FIG. 7, a metal film is evaporated on one lot of wafers. Next, at step 302, a photoresist is coated on the metal film on the lot of wafers. Then, at step 303, images of patterns on the mask are sequentially exposed and transferred in each shot region on the lot of wafers through a projection optical system using an exposure apparatus of any of the embodiments. Next, after developing the photoresist on the lot of wafers at step 304, a circuit pattern corresponding to the pattern on the mask is formed on each shot region on each wafer by etching using the resist pattern as a mask at step 305.

Next, a device such as a semiconductor device is produced by forming a plurality of layered circuit patterns using the above steps. The aforementioned semiconductor device production method enables, with excellent throughput, production of semiconductor devices having very fine circuit patterns. It is obvious here that, instead of the aforementioned method in which vaporizing metal on a wafer and coating a resist on the metal on the wafer, followed by exposure, development and etching steps in steps 301–305, a method in which a silicon oxidation film is formed on the wafer first, then resist is coated on the silicon oxidation film, followed by exposure, development and etching may be used.

Figure 8:
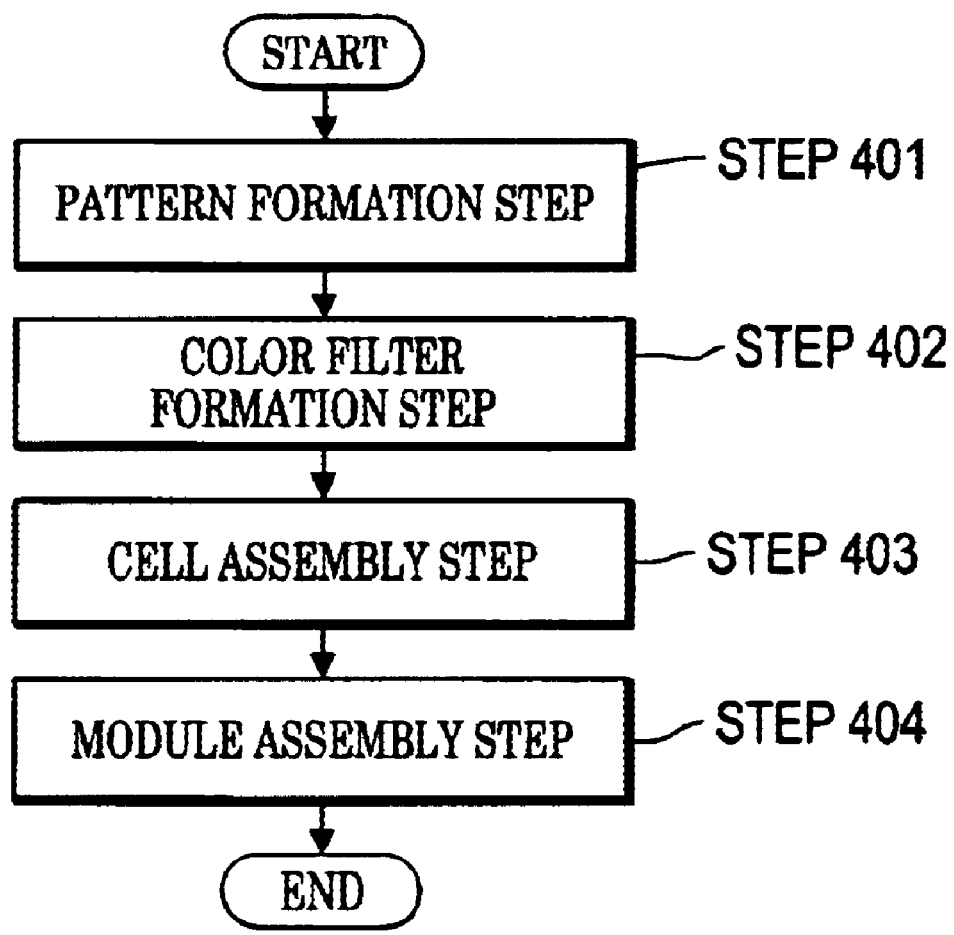
FIG. 8 is a flow chart illustrating a method of producing a liquid crystal display element as an example of microdevice.

The exposure apparatus of each embodiment enables production of liquid crystal display elements, as another example of a microdevice, through formation of predetermined patterns (circuit pattern, electrode pattern and the like) on a plate (glass substrate). Hereafter, an example of this production method will be described using the flowchart in FIG. 8 as a reference. In FIG. 8, a pattern on the mask is exposed and transferred onto a photosensitive substrate (glass substrate on which resist is coated and the like) using an exposure apparatus of any of the embodiments during a pattern formation step 401, which is commonly referred to as a lithography step. By this lithography step, the predetermined pattern containing many electrodes and the like is formed on the photosensitive substrate. Then, the predetermined patterns are formed on the exposed substrate through a development step, an etching step, a mask peeling step, after which the substrate moves to color filter formation step 402.

Next, a color filter in which many sets of three dots corresponding to R (red), G (green) and B (blue) are arranged in a matrix, or a plurality of sets of three R, G, B stripe filters are arranged in a horizontal scanning direction is formed in a color filter formation step 402. A cell assembly step 403 is executed after the color filter formation step 402. In the cell assembly step 403, a liquid crystal panel (liquid crystal cell) is assembled using the substrate having the predetermined pattern which is obtained at the pattern formation step 401 and the color filter which is obtained at the color filter formation step 402. At cell assembly step 403, liquid crystal panel (liquid crystal cell) is produced by injecting a liquid crystal material between the substrate having the predetermined pattern obtained at pattern formation step 401 and the color filter obtained at the color filter formation step 402, for example.

Then the liquid crystal display element is completed in the module assembly step 404, by installing electric circuits, a backlight and the like, which enables display of motion by the liquid crystal panel (liquid crystal cell) assembled. The aforementioned production method enables production with excellent throughput of a liquid crystal display element having a very fine circuit pattern.

Here, in each of the aforementioned embodiments, the present invention is applied to a projection optical system provided in an exposure apparatus, but the present invention may be applied to other general optical systems. Moreover in each of the aforementioned embodiments, an ArF excimer laser light source which supplies light having 193 nm wavelength and an $F_2$ laser light source which supplies light having 157 nm wavelength, but other light sources such as Ar laser light source which supplies light of 126 nm wavelength may also be used.

As described above, in the present invention, an optical system having excellent optical performance with substantially no impact of birefringence is achieved even when a birefringent crystal material such as fluorite is used. Hence, excellent microdevices may be produced by installing the optical system of the present invention into an exposure apparatus which enables highly precise projection exposure using a high resolution projection optical system.

While the invention has been described with reference to preferred embodiments thereof, it is to be understood that the invention is not limited to the preferred embodiments or constructions. To the contrary, the invention is intended to cover various modifications and equivalent arrangements conceived by those skilled in lithographic systems. In addition, while the various elements of the preferred embodiments are shown in various combinations and configurations, which are exemplary, other combinations and configurations, including more, less or only a single element, are also within the spirit and scope of the invention.

What is claimed is:

1. An optical system having a plurality of crystal optical elements formed with cubic system crystals, wherein:

the plurality of crystal optical elements comprise first crystal optical elements having a first crystal axis that substantially coincides with an optical axis of the optical system, and second crystal optical elements having a second crystal axis which is different from the first crystal axis, and that substantially coincides with the optical axis;

the plurality of crystal optical elements Gj are arranged in such a manner that a direction of a predetermined crystal axis in a surface perpendicular to the optical axis is rotated ρj around the optical axis relative to a predetermined axis in the surface;

for a specific light beam passing through the plurality of crystal optical elements Gj, a first evaluation amount Rj for a first predetermined polarization and a second evaluation amount Sj for a second predetermined polarization which are determined by a material constant α of the crystal, the crystal axis substantially coinciding with the optical axis, an angle ρj, an angle θj, an angle Φj and an optical path length Lj are established, where θj is an angle between the specific light beam and the direction of the optical axis, Φj is an angle between the specific light beam and the direction of the predetermined axis, and Lj is the optical path length of the specific optical path; and a first sum of evaluation amounts ΣRj which is a sum of the first evaluation amount Rj for the plurality of crystal optical elements, and a second sum of evaluation amounts ΣSj which is a sum of the second evaluation amount Sj for the plurality of crystal optical elements have a predetermined relationship for light beams in imaging beams converged on at least one arbitrary point on an image plane or an object plane of the optical system.

2. An optical system of claim 1, wherein the first evaluation amount Rj is information concerning a change in optical path length for the first predetermined polarization, and the second evaluation amount Sj is information concerning a change in optical path length for the second predetermined polarization.

3. An optical system of claim 1, wherein the predetermined relationship includes a relationship in which the sum of the first evaluation amounts Rj are substantially equal for light beams in imaging beams converged on the at least one arbitrary point on the image plane or the object plane of the optical system, the second sum of evaluation amounts ΣSj are substantially equal for light beams in imaging beams converged on the at least one arbitrary point on the image plane or the object plane of the optical system, and the sum of the first evaluation amounts Rj and the second total evaluation amounts ΣSj are substantially equal to each other for light beams in imaging beams converged on the at least one arbitrary point on the image plane or the object plane of the optical system.

4. An optical system of claim 1, wherein the first evaluation amount Rj and the second evaluation amount Sj are represented by the following equations, and the crystal optical elements Gj are set in such a manner that the optical axis substantially coincides with the crystal axis [111] or a crystal axis optically equivalent thereto, and the predetermined crystal axis is the crystal axis [−110] or a crystal axis optically equivalent thereto:

$$Rj = \alpha \times Lj \times [56 \times \{1 - \cos(4\theta j)\} - 32\sqrt{2} \times \sin(4\theta j) \times \sin(3\omega j)]/192$$

$$Sj = \alpha \times Lj \times [32 \times \{1 - \cos(2\theta j)\} + 64\sqrt{2} \times \sin(2\theta j) \times \sin(3\omega j)]/192,$$

wherein $\omega j = \Phi j - \rho j$.

5. An optical system of claim 1, wherein the first evaluation amount Rj and the second evaluation amount Sj are represented by the following equations, and the crystal optical elements Gj are set in such a manner that the optical axis substantially coincides with the crystal axis [001] or a crystal axis optically equivalent thereto, and the predetermined crystal axis is the crystal axis [110] or a crystal axis optically equivalent thereto:

$$Rj = \alpha \times Lj \times \{1 - \cos(4\theta j)\} \times (-84 - 12 \times \cos(4\omega j))/192$$

$$Sj = \alpha \times Lj \times \{1 - \cos(2\theta j)\} \times (-48 + 48 \times \cos(4\omega j))/192$$

wherein $\omega j = \Phi j - \rho j$.

6. An optical system of claim 1, wherein the first evaluation amount Rj and the second evaluation amount Sj are represented by the following equations, and the crystal optical elements Gj are set in such a manner that the optical axis substantially coincides with the crystal axis [011] or a crystal axis optically equivalent thereto, and the predetermined crystal axis is the crystal axis [100] or a crystal axis optically equivalent thereto:

$Rj=\alpha \times Lj \times [\{1-\cos(4\theta j)\} \times \{21-9\times\cos(4\omega j)-84\times\cos(2\omega j)\}+96\times\cos(2\omega j)]/192$ $Sj=\alpha \times Lj \times [\{1-\cos(2\theta j)\} \times \{12+36\times\cos(4\omega j)+48\times\cos(2\omega j)\}-96\times\cos(2\omega j)]/192$ wherein $\omega j=\Phi j-\rho j$.

7. An optical system of claim 1, wherein the material constant a of the crystal is a difference between a refractive index n100 of a light beam having a polarization direction in the direction of the crystal axis [100] or a crystal axis optically equivalent thereto, and a refractive index n011 of a light beam having a polarization direction in the direction of the crystal axis [0-11] or a crystal axis optically equivalent thereto, out of light beams advancing in the direction of the crystal axis [011] or a crystal axis optically equivalent thereto, out of all crystals forming each crystal optical element Gj.

8. An optical system of claim 1, wherein an absolute value of a difference between the first sum of evaluation amounts ΣRj and the second sum of evaluation amounts ΣSj is set to be smaller than λ/2 for light beams in imaging beams converged on the at least one arbitrary point on the image plane or the object plane of the optical system, wherein λ is the wavelength of the light beam.

9. An optical system of claim 1, wherein an absolute value of a difference between the first sum of evaluation amounts ΣRj and a predetermined value is set to be smaller than λ/2 for light beams in imaging beams converged on the at least one arbitrary point on the image plane or the object plane of the optical system, wherein λ is the wavelength of the light beam.

10. An optical system of claim 1, wherein an absolute value of a difference between the second sum of evaluation amounts ΣSj and a predetermined value is set to be smaller than λ/2 for light beams in imaging beams converged on the at least one arbitrary point on the image plane or the object plane of the optical system, wherein λ is the wavelength of the light beam.

11. An optical system having a plurality of crystal optical elements formed with cubic system crystals, wherein M (M is a whole number greater than or equal to 3) of the crystal optical elements are disposed in such a manner that their optical axis substantially coincides with a crystal axis [111] or a crystal axis optically equivalent thereto, and wherein the M crystal optical elements have a rotational position relationship in which directions of a crystal axis [1-10] or a crystal axis optically equivalent thereto are mutually separated by substantially (120/M) degrees in a surface perpendicular to the optical axis.

12. An optical system of claim 11, wherein N (N is a whole number greater than or equal to 3) of the crystal optical elements are disposed in such a manner that their optical axis substantially coincides with a crystal axis [001] or a crystal axis optically equivalent thereto, and wherein the N crystal optical elements have a rotational position relationship in which directions of a crystal axis [100] or a crystal axis optically equivalent thereto are mutually separated by substantially (90/N) degrees in the surface perpendicular to the optical axis.

13. An optical system of claim 11, wherein L (L is a whole number greater than or equal to 3) of the crystal optical elements are disposed in such a manner that their optical axis substantially coincides with a crystal axis [011] or a crystal axis optically equivalent thereto, and wherein the L crystal optical elements have a rotational position relationship in which directions of the crystal axis [100] or the crystal axis optically equivalent thereto are mutually separated by substantially (180/L) degrees in the surface perpendicular to the optical axis.

14. An optical system of claim 11, wherein P (P is a whole number greater than or equal to 2) of the crystal optical elements are disposed in such a manner that their optical axis substantially coincides with a crystal axis [011] or a crystal axis optically equivalent thereto, and wherein the P crystal optical elements have a rotational position relationship in which directions of a crystal axis [100] or a crystal axis optically equivalent thereto are mutually separated by substantially (90/P) degrees in the surface perpendicular to the optical axis.

15. An optical system having a plurality of crystal optical elements formed with cubic system crystals, wherein N (N is a whole number greater than or equal to 3) of the crystal optical elements are disposed in such a manner that their optical axis substantially coincides with a crystal axis [001] or a crystal axis optically equivalent thereto, and wherein the N crystal optical elements have a rotational position relationship in which directions of a crystal axis [100] or a crystal axis optically equivalent thereto are mutually separated by substantially (90/N) degrees in a surface perpendicular to the optical axis.

16. An optical system of claim 15, wherein L (L is a whole number greater than or equal to 3) of the crystal optical elements are disposed in such a manner that their optical axis substantially coincides with a crystal axis [011] or a crystal axis optically equivalent thereto, and wherein the L crystal optical elements have a rotational position relationship in which directions of the crystal axis [100] or the crystal axis optically equivalent thereto are mutually separated by substantially (180/L) degrees in the surface perpendicular to the optical axis.

17. An optical system of claim 15, wherein P (P is a whole number greater than or equal to 2) of the crystal optical elements are disposed in such a manner that their optical axis substantially coincides with a crystal axis [011] or a crystal axis optically equivalent thereto, and wherein the P crystal optical elements have a rotational position relationship in which directions of the crystal axis [100] or the crystal axis optically equivalent thereto are mutually separated by substantially (90/P) degrees in the surface perpendicular to the optical axis.

18. An optical system having a plurality of crystal optical elements formed with cubic system crystals, wherein L (L is a whole number greater than or equal to 3) of the crystal optical elements are disposed in such a manner that their optical axis substantially coincides with a crystal axis [011] or a crystal axis optically equivalent thereto, and wherein the L crystal optical elements have a rotational position relationship in which directions of a crystal axis [100] or a crystal axis optically equivalent thereto are mutually separated by substantially (180/L) degrees in a surface perpendicular to the optical axis.

19. An optical system of claim 18, wherein P (P is a whole number greater than or equal to 2) of the crystal optical elements are disposed in such a manner that their optical axis substantially coincides with the crystal axis [011] or a crystal axis optically equivalent thereto, and wherein the P crystal optical elements have a rotational position relationship in which directions of the crystal axis [100] or the crystal axis optically equivalent thereto are mutually separated by substantially (90/P) degrees in the surface perpendicular to the optical axis.

20. An optical system of claim 1, wherein the crystal is either a calcium fluoride crystal or a barium fluoride crystal.

21. An exposure apparatus comprising an illumination system for illuminating a mask and an optical system of claim 1 for forming images of a pattern formed on the mask onto a photosensitive substrate.

22. A microdevice production method comprising exposing a pattern of a mask onto a photosensitive substrate using the exposure apparatus of claim 21, and developing the exposed photosensitive substrate.

23. An optical system of claim 11, wherein the crystal is either a calcium fluoride crystal or a barium fluoride crystal.

24. An exposure apparatus comprising an illumination system for illuminating a mask and an optical system of claim 11 for forming images of a pattern formed on the mask onto a photosensitive substrate.

25. A microdevice production method comprising exposing a pattern of a mask onto a photosensitive substrate using the exposure apparatus of claim 24, and developing the exposed photosensitive substrate.

26. An optical system of claim 15, wherein the crystal is either a calcium fluoride crystal or a barium fluoride crystal.

27. An exposure apparatus comprising an illumination system for illuminating a mask and an optical system of claim 15 for forming images of a pattern formed on the mask onto a photosensitive substrate.

28. A microdevice production method comprising exposing a pattern of a mask onto a photosensitive substrate using the exposure apparatus of claim 27, and developing the exposed photosensitive substrate.

29. An optical system of claim 18, wherein the crystal is either a calcium fluoride crystal or a barium fluoride crystal.

30. An exposure apparatus comprising an illumination system for illuminating a mask and an optical system of claim 18 for forming images of a pattern formed on the mask onto a photosensitive substrate.

31. A microdevice production method comprising exposing a pattern of a mask onto a photosensitive substrate using the exposure apparatus of claim 30, and developing the exposed photosensitive substrate.

* * * * *